(12) United States Patent
Fujii et al.

(10) Patent No.: US 10,234,517 B2
(45) Date of Patent: Mar. 19, 2019

(54) MAGNETISM MEASURING DEVICE, MANUFACTURING METHOD OF MAGNETISM MEASURING DEVICE, GAS CELL, AND MANUFACTURING METHOD OF GAS CELL

(71) Applicant: SEIKO EPSON CORPORATION, Tokyo (JP)

(72) Inventors: Eiichi Fujii, Shiojiri (JP); Kimio Nagasaka, Hokuto (JP)

(73) Assignee: SEIKO EPSON CORPORATION, Tokyo (JP)

( * ) Notice: Subject to any disclaimer, the term of this patent is extended or adjusted under 35 U.S.C. 154(b) by 367 days.

(21) Appl. No.: 15/132,728

(22) Filed: Apr. 19, 2016

(65) Prior Publication Data

US 2016/0313418 A1   Oct. 27, 2016

(30) Foreign Application Priority Data

Apr. 22, 2015   (JP) .................. 2015-087329

(51) Int. Cl.
*G01R 33/26* (2006.01)
*G01R 33/00* (2006.01)

(52) U.S. Cl.
CPC ......... *G01R 33/26* (2013.01); *G01R 33/0052* (2013.01)

(58) Field of Classification Search
CPC .................. G01R 33/26; G01R 33/0052
USPC .............. 324/304, 305, 244.1, 244, 260
See application file for complete search history.

(56) References Cited

U.S. PATENT DOCUMENTS

| | | | |
|---|---|---|---|
| 8,904,627 B2 * | 12/2014 | Nagasaka | G01R 33/0076 29/428 |
| 9,151,808 B2 | 10/2015 | Nagasaka et al. | |
| 9,684,041 B2 * | 6/2017 | Nagasaka | G01R 33/032 |

FOREIGN PATENT DOCUMENTS

JP   2012-183290 A   9/2012

OTHER PUBLICATIONS

D. Budker et al. "Resonant Nonlinear Magneto-Optical Effects in Atoms", Review of Modern Physics, vol. 74, Oct. (2002), pp. 1153-1201.

* cited by examiner

*Primary Examiner* — Reena Aurora
(74) *Attorney, Agent, or Firm* — Oliff PLC

(57) ABSTRACT

A magnetism measuring device includes: a wall forming a cell portion; an opening which is open to a portion of the wall; a sealing material which seals the opening; a coating layer which covers the sealing material on an inside of the cell portion; and an alkali metal gas which is sealed in the cell portion.

13 Claims, 15 Drawing Sheets

MAGNETISM MEASURING DEVICE, MANUFACTURING METHOD OF MAGNETISM MEASURING DEVICE, GAS CELL, AND MANUFACTURING METHOD OF GAS CELL

BACKGROUND

1. Technical Field

The present invention relates to a magnetism measuring device, a manufacturing method of a magnetism measuring device, a gas cell, and a manufacturing method of a gas cell.

2. Related Art

An optical pumping type magnetism measuring device which irradiates a gas cell, in which an alkali metal gas is sealed, with linearly polarized light and measures a magnetic field according to a rotation angle of a polarization plane is known (for example, refer to JP-A-2012-183290). JP-A-2012-183290 discloses the configuration of a gas cell, in which an ampoule containing an alkali metal sealed therein is accommodated in a cell, the cell is sealed, the ampoule is irradiated with laser light so as to form a through-hole in a glass tube of the ampoule, and the alkali metal in the ampoule is vaporized to fill the inside of the cell with the vapor (gas) thereof.

According to the description of JP-A-2012-183290, the cell is formed by joining a package (container) and a lid (lid portion), which are made of glass, to each other using a sealing material such as low-melting-point glass. In order to enhance non-relaxation characteristics, a coating layer is formed on the inner wall of the cell by allowing a coating material made of a chain saturated hydrocarbon (paraffin or the like) to flow into the cell from a flow passage. In addition, the vapor (gas) of the alkali metal is allowed to diffuse in the cell, and thereafter the flow passage of the coating material is sealed by the sealing material such as low-melting-point glass.

However, the alkali metal has high reactivity, and low-melting-point glass generally has low chemical resistance. Therefore, when the inside of the gas cell is filled with the gas of the alkali metal, there may be a case where a chemical reaction between the alkali metal and the low-melting-point glass occurs. When the chemical reaction between the alkali metal and the low-melting-point glass occurs, the amount of the gas of the alkali metal in the gas cell is reduced due to a chemical change in the alkali metal, and the gas of the alkali metal leaks to the outside of the gas cell due to the deterioration in the seal caused by a chemical change in the sealing material (the low-melting-point glass). As a result, there are problems in that there is concern that the manufacturing yield of the gas cell and the magnetism measuring device may be reduced or there is concern that the sensitivity of the magnetism measuring device may not be maintained for a long period of time due to a reduction in the service life of the gas cell.

SUMMARY

An advantage of some aspects of the invention is to solve at least a part of the problems described above, and the invention can be implemented as the following forms or application examples.

Application Example 1

A magnetism measuring device according to this application example includes: a wall forming a closed container; a first hole which is open to a portion of the wall; a sealing material which seals the first hole; a chain saturated hydrocarbon which covers the sealing material on an inside of the closed container; and an alkali metal gas which is sealed in the closed container.

According to the configuration of this application example, in the magnetism measuring device, the first hole which is open to the portion of the wall forming the closed container is sealed by the sealing material, and the sealing material on the inside of the closed container is covered with the chain saturated hydrocarbon. Therefore, the alkali metal gas sealed in the closed container does not come into contact with the sealing material, and thus a chemical reaction between the alkali metal having high reactivity and the sealing material can be suppressed. Accordingly, a reduction in the amount of the alkali metal gas due to a chemical change in the alkali metal, and leakage of the alkali metal gas due to the deterioration in the seal caused by a chemical change in the sealing material are prevented. Therefore, the sensitivity of the magnetism measuring device can be maintained for a long period of time.

Application Example 2

In the magnetism measuring device according to the application example, it is preferable that the magnetism measuring device further includes a lid which covers the first hole, and the sealing material is disposed to surround the first hole between the lid and the wall.

According to the configuration of this application example, since the first hole is blocked by the lid and the lid and the wall of the closed container are fixed to each other via the sealing material, the closed container can be more firmly sealed compared to a case where the first hole is sealed only by the sealing material. In addition, since the sealing material is disposed between the lid and the wall, that is, disposed to surround the first hole on the outside of the closed container, it is possible to further increase the distance between the sealing material and the alkali metal gas compared to the case where the first hole is sealed only by the sealing material. Accordingly, a chemical reaction between the alkali metal and the sealing material can be more effectively suppressed.

Application Example 3

In the magnetism measuring device according to the application example, it is preferable that the closed container includes a first chamber, and a second chamber which is connected to the first chamber via a second hole, and the first hole is formed in the wall of the second chamber.

According to the configuration of this application example, the closed container includes the first chamber and the second chamber which are connected to each other via the second hole, and the first hole is formed in the wall of the second chamber. Therefore, when the closed container is heated to allow the chain saturated hydrocarbon to be transitioned to gas and precipitate to the inside of the first chamber and the second chamber, if the temperature of the second chamber side becomes lower than the temperature of the first chamber side, the amount of the chain saturated hydrocarbon precipitated to the second chamber side on which the first hole is provided can be greater than that on the first chamber side. Accordingly, the amount of the chain saturated hydrocarbon that covers the sealing material for sealing the first hole can be further increased, and thus a chemical reaction between the alkali metal and the sealing material can be more reliably suppressed.

Application Example 4

In the magnetism measuring device according to the application example, it is preferable that the first hole is formed in the wall of the second chamber on a site opposite to the first chamber.

According to the configuration of this application example, the first hole is formed in the wall of the second chamber on the side opposite to the first chamber, that is, in the wall of the second chamber, which is at a position distant from the first chamber. Therefore, when the temperature of the second chamber side becomes lower than the temperature of the first chamber side, the amount of the chain saturated hydrocarbon precipitated to the position at which the first hole is provided can be further increased than that on the first chamber side.

Application Example 5

A manufacturing method of a magnetism measuring device according to this application example includes: forming a container which is formed of a wall, has a first hole that is open to a portion of the wall, and accommodates an ampoule, in which a material having alkali metal atoms is sealed, and a chain saturated hydrocarbon; sealing the first hole using a sealing material; heating the container sealed by the sealing material to a first temperature; and cooling the container sealed by the sealing material to a second temperature lower than the first temperature.

According to the manufacturing method of this application example, the container which is formed of the wall and has the chain saturated hydrocarbon disposed therein is formed in the forming of the container, and the first hole which is open to the portion of the wall is sealed by using the sealing material in the sealing of the first hole to close the container. Thereafter, since the sealed container is heated to the first temperature in the heating of the container, it is possible to allow the chain saturated hydrocarbon to be vaporized in the container. In addition, since the container is cooled to the second temperature lower than the first temperature during the cooling of the container, the chain saturated hydrocarbon vaporized in the container is allowed to precipitate and cover the sealing material, thereby protecting the sealing material. Therefore, the deterioration of the seal caused by a chemical change in the sealing material or the like is prevented, and thus the magnetism measuring device which can maintain its sensitivity for a long period of time can be manufactured.

Application Example 6

In the manufacturing method of a magnetism measuring device according to the application example, it is preferable that breaking the ampoule after the cooling of the container is further included.

According to the manufacturing method of this application example, since the ampoule is broken after the cooling of the container, the material having alkali metal atoms in the ampoule is released toward the inside of the container and is gasified such that the container is filled with the alkali metal gas. Here, since the sealing material is covered with the chain saturated hydrocarbon and thus does not come into contact with the alkali metal gas, a chemical reaction between the alkali metal having high reactivity and the sealing material can be suppressed. Accordingly, a reduction in the amount of the alkali metal gas due to a chemical change in the alkali metal, and leakage of the alkali metal gas due to the deterioration in the seal caused by a chemical change in the sealing material are prevented. Therefore, the magnetism measuring device which can maintain its sensitivity for a long period of time can be stably manufactured.

Application Example 7

In the manufacturing method of a magnetism measuring device according to the application example, it is preferable that the first temperature is higher than a melting point of the chain saturated hydrocarbon, and the second temperature is lower than the melting point of the chain saturated hydrocarbon.

According to the manufacturing method of this application example, since the container is heated to the first temperature higher than the melting point of the chain saturated hydrocarbon during the heating of the container, the chain saturated hydrocarbon can be vaporized in the container. In addition, since the container is cooled to the second temperature lower than the melting point of the chain saturated hydrocarbon during the cooling of the container, the vaporized chain saturated hydrocarbon can be allowed to precipitate to the surface of the sealing material and cover the sealing material.

Application Example 8

In the manufacturing method of a magnetism measuring device according to the application example, it is preferable that, in the cooling of the container, there is a period in which a temperature of a portion of the container at which the first hole is positioned is lower than temperatures of the other parts.

According to the manufacturing method of this application example, since there is a period in which the temperature of the portion at which the first hole is positioned is lower than the temperatures of the other parts during the cooling of the container, the chain saturated hydrocarbon is more likely to precipitate to the periphery of the first hole than the other parts. Therefore, it is possible to allow the film thickness of the chain saturated hydrocarbon that covers the periphery of the first hole sealed by the sealing material to be greater than the film thickness of the chain saturated hydrocarbon that covers the other parts. Accordingly, a chemical reaction between the alkali metal and the sealing material can be effectively suppressed.

Application Example 9

In the manufacturing method of a magnetism measuring device according to the application example, it is preferable that, in the cooling of the container, the portion of the container at which the first hole is positioned reaches the second temperature faster than the other parts.

According to the manufacturing method of this application example, since the portion at which the first hole is positioned reaches the second temperature faster than the other parts during the cooling of the container, the chain saturated hydrocarbon precipitates to the periphery of the first hole faster than to the other parts. Therefore, the amount of the chain saturated hydrocarbon precipitated to the periphery of the first hole sealed by the sealing material can be allowed to be greater than that to the other parts and the film thickness of the periphery can be increased.

Application Example 10

In the manufacturing method of a magnetism measuring device according to the application example, it is preferable that the container is a closed container which is formed of the wall and has the first hole which is open to the portion of the wall, and the forming of the container includes disposing the ampoule and the chain saturated hydrocarbon in the container through the first hole, and evacuating an inside of the container through the first hole.

According to the manufacturing method of this application example, during the forming of the container, the ampoule and the chain saturated hydrocarbon are disposed in the container through the first hole that is open to the portion of the wall, and the inside of the container is evacuated through the first hole. Thereafter, the first hole is sealed by using the sealing material during the sealing of the first hole, and thus the container can be sealed in a state in which the ampoule and the chain saturated hydrocarbon are sealed therein.

Application Example 11

In the manufacturing method of a magnetism measuring device according to the application example, it is preferable that the container includes a concave container body, which is formed of the wall and has the first hole, and an upper lid, which is positioned on an upper side of the container body, and the forming of the container includes disposing the ampoule and the chain saturated hydrocarbon in the container body, fixing the upper lid to the upper side of the container body to allow the container to be a closed container, and evacuating an inside of the container through the first hole.

According to the manufacturing method of this application example, during the forming of the container, the ampoule and the chain saturated hydrocarbon are disposed in the concave container body, the upper lid is fixed to the upper side of the container body to form the closed container, and the inside of the container is evaluated through the first hole. Thereafter, the first hole is sealed by using the sealing material during the sealing of the first hole, and thus the container can be sealed in a state in which the ampoule and the chain saturated hydrocarbon are sealed therein.

Application Example 12

A gas cell according to this application example includes: a wall forming a closed container; a first hole which is open to a portion of the wall; a sealing material which seals the first hole; a chain saturated hydrocarbon which covers the sealing material on an inside of the closed container; and an alkali metal gas which is sealed in the closed container.

According to the configuration of this application example, the first hole which is open to the portion of the wall forming the closed container is sealed by the sealing material, and the sealing material on the inside of the closed container is covered with the chain saturated hydrocarbon. Therefore, the alkali metal gas does not come into contact with the sealing material, and thus a chemical reaction between the alkali metal gas having high reactivity and the sealing material can be suppressed. Accordingly, a reduction in the amount of the alkali metal gas due to a chemical change in the alkali metal, and leakage of the alkali metal gas due to the deterioration in the seal caused by a chemical change in the sealing material are prevented. Therefore, the service life of the gas cell can be increased. As a result, the sensitivity of a magnetism measuring device provided with the gas cell can be maintained for a long period of time.

Application Example 13

A manufacturing method of a gas cell according to this application example includes: forming a container which is formed of a wall, has a first hole that is open to a portion of the wall, and accommodates an ampoule, in which a material having alkali metal atoms is sealed, and a chain saturated hydrocarbon; sealing the first hole using a sealing material; heating the container sealed by the sealing material to a first temperature; and cooling the container sealed by the sealing material to a second temperature lower than the first temperature.

According to the manufacturing method of this application example, the container which is formed of the wall and has the chain saturated hydrocarbon disposed therein is formed, the container is closed by sealing the first hole that is open to the portion of the wall using the sealing material, and thereafter the container is heated to the first temperature during the heating of the container. Therefore, the chain saturated hydrocarbon can be vaporized in the container. In addition, since the container is cooled to the second temperature lower than the first temperature during the cooling of the container, the vaporized chain saturated hydrocarbon can be allowed to precipitate and cover the sealing material. Accordingly, a chemical reaction between the alkali metal and the sealing material can be suppressed, and thus the gas cell having a long service life can be stably manufactured.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, embodiments which embody the invention will be described with reference to the drawings. The drawings that are used are appropriately enlarged, reduced, or exaggerated to allow described parts to be recognizable. In addition, there may be a case where the illustration of constituent elements which are not necessary for description is omitted.

First Embodiment

Configuration of Magnetism Measuring Device

Figure 1:
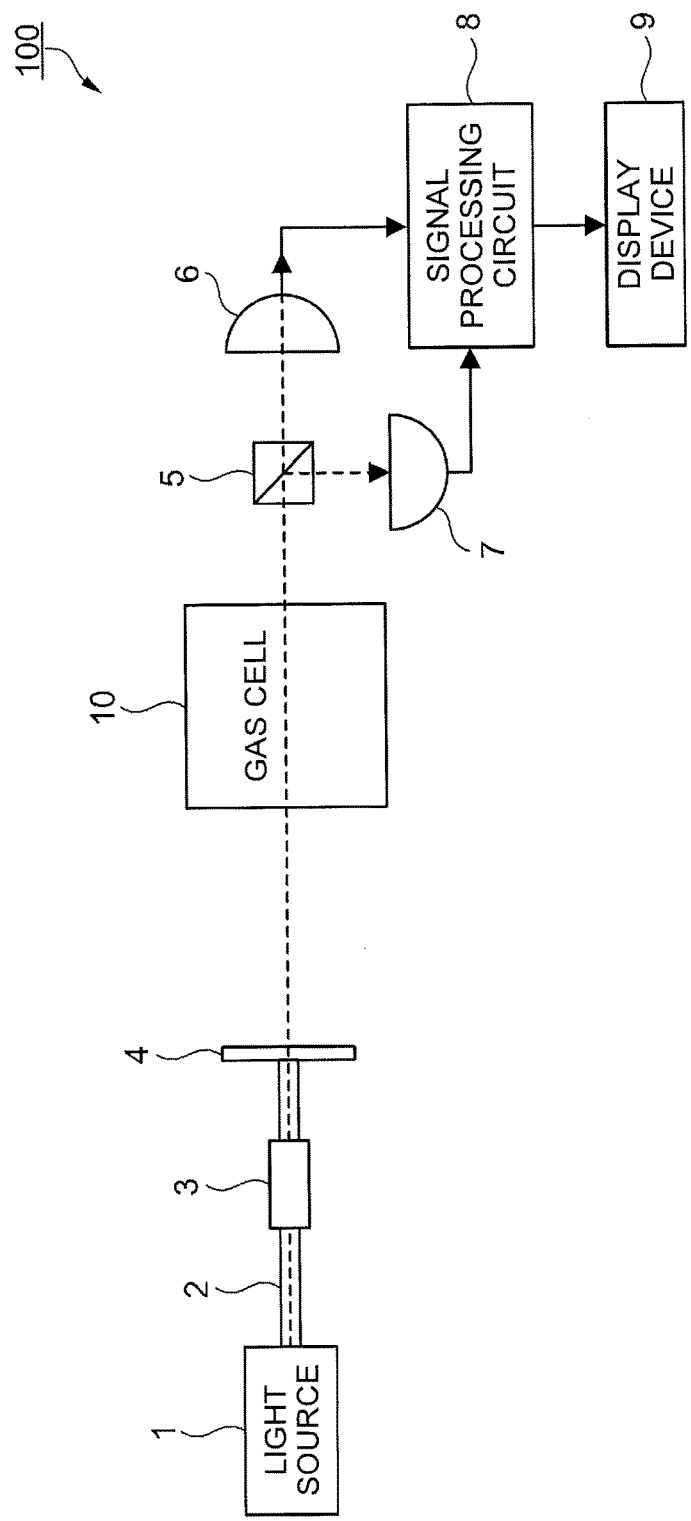
FIG. 1 is a block diagram illustrating the configuration of a magnetism measuring device according to a first embodiment.

The configuration of a magnetism measuring device according to a first embodiment will be described with reference to FIG. 1. FIG. 1 is a block diagram illustrating the configuration of the magnetism measuring device according to this embodiment. A magnetism measuring device 100 according to the first embodiment is a magnetism measuring device which uses nonlinear magneto-optical rotation (NMOR). The magnetism measuring device 100 is used in, for example, a living body state measuring device (magnetocardiography, magnetoencephalography, or the like) which measures a weak magnetic field generated from a living body such as a magnetic field from the heart (cardiac magnetism) or a magnetic field from the brain (cerebral magnetism). The magnetism measuring device 100 may also be used in a metal detector or the like.

As illustrated in FIG. 1, the magnetism measuring device 100 includes a light source 1, an optical fiber 2, a connector 3, a polarizing plate 4, a gas cell 10, a polarization splitter 5, a photodetector (PD) 6, a photodetector 7, a signal processing circuit 8, and a display device 9. An alkali metal gas (an alkali metal in a gas state) is sealed in the gas cell 10. As the alkali metal, for example, cesium (Cs), rubidium (Rb), potassium (K), or sodium (Na) may be used. In the following description, a case where cesium is used as the alkali metal is exemplified.

The light source 1 is a device which outputs a laser beam having a wavelength corresponding to the cesium absorption lines (for example, 894 nm corresponding to the D1 line), for example, a tunable laser. The laser beam output from the light source 1 is so-called continuous wave (CW) light having a continuously constant light intensity.

The polarizing plate 4 is an element which polarizes the laser beam in a specific direction into linearly polarized light. The optical fiber 2 is a member which guides the laser beam output from the light source 1 to the gas cell 10 side. As the optical fiber 2, for example, a single-mode optical fiber which propagates only a basic mode is used. The connector 3 is a member for connecting the optical fiber 2 to the polarizing plate 4. The connector 3 connects the optical fiber 2 to the polarizing plate 4 in a screw type.

The gas cell 10 is a box (cell) having a void therein, and the gas of the alkali metal (in this example, cesium) is sealed in the void. The configuration of the gas cell 10 will be described later.

The polarization splitter 5 is an element which splits the incident laser beam into beams having two polarization components that are perpendicular to each other. The polarization splitter 5 is, for example, a Wollaston prism is or a polarizing beam splitter. The photodetector 6 and the photodetector 7 are detectors having sensitivity to the wavelength of the laser beam, and output currents corresponding to the light intensity of the incident light to the signal processing circuit 8. If the photodetector 6 and the photodetector 7 generate magnetic fields, there is a possibility that the measurement may be affected. Therefore, it is preferable that the photodetector 6 and the photodetector 7 are formed of a non-magnetic material. The photodetector 6 and the photodetector 7 are disposed on the same side as that of the polarization splitter 5 (downstream side) when viewed from the gas cell 10.

The arrangement of the parts in the magnetism measuring device 100 will be described along the path of the laser beam. At the uppermost position in the path of the laser beam, the light source 1 is positioned. From the upstream side therebelow, the optical fiber 2, the connector 3, the polarizing plate 4, the gas cell 10, the polarization splitter 5, and the photodetectors 6 and 7 are arranged in this order.

The operation of each part in the magnetism measuring device 100 will be described along the propagation of the laser beam. The laser beam output from the light source 1 is guided to the optical fiber 2 and reaches the polarizing plate 4. The laser beam that reaches the polarizing plate 4 becomes linearly polarized light having higher polarization degree. The laser beam that passes through the gas cell 10 allows the alkali metal atoms sealed in the gas cell 10 to excite (optical pumping). At this time, the laser beam undergoes a polarization plane rotation action according to the intensity of a magnetic field such that the polarization plane is rotated. The laser beam that has passed through the gas cell 10 is split into beams having two polarization components by the polarization splitter 5. The light intensities of the beams having the two polarization components are measured by the photodetectors 6 and 7 (probing).

The signal processing circuit 8 receives signals indicating the light intensities of the beams measured by the photodetectors 6 and 7. The signal processing circuit 8 measures the rotation angle of the polarization plane of the laser beam on the basis of the received signals. The rotation angle of the polarization plane is expressed by a function based on the intensity of the magnetic field in the propagation direction of the laser beam (for example, refer to Expression (2) of "Resonant nonlinear magneto-optical effects in atoms" in Reviews of Modern Physics., APS through AIP, USA, October 2002, vol. 74, no. 4, p. 1153-1201, by D. Budker et al. Although Expression (2) is associated with linear optical rotation, substantially the same equation may be used even in the case of NMOR). The signal processing circuit 8 measures the intensity of the magnetic field in the propagation direction of the laser beam from the rotation angle of the polarization plane. The display device 9 displays the intensity of the magnetic field measured by the signal processing circuit 8.

Figure 2A:
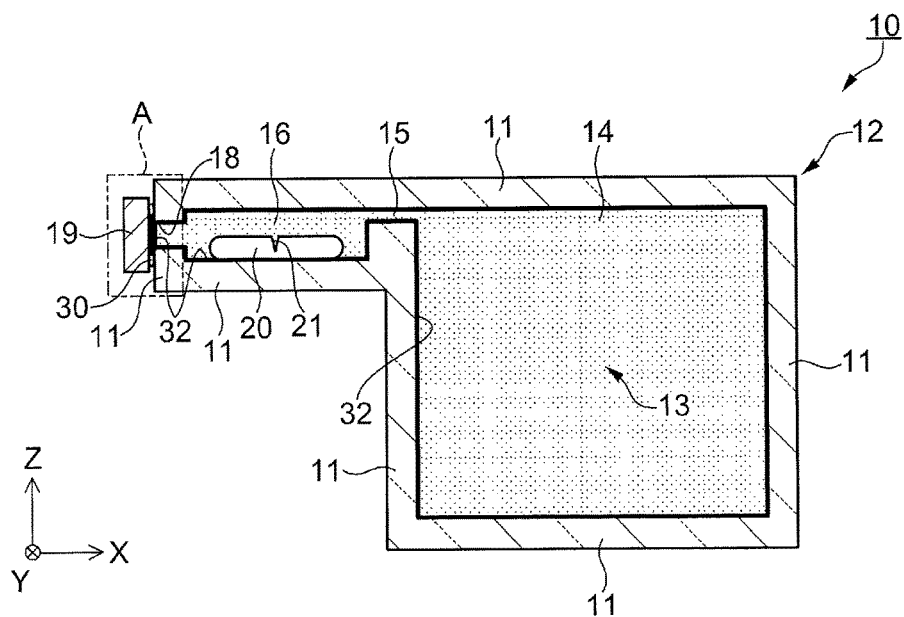
FIGS. 2A to 2C are schematic sectional views illustrating the configurations of a gas cell and an ampoule according to the first embodiment.
Figure 2B:
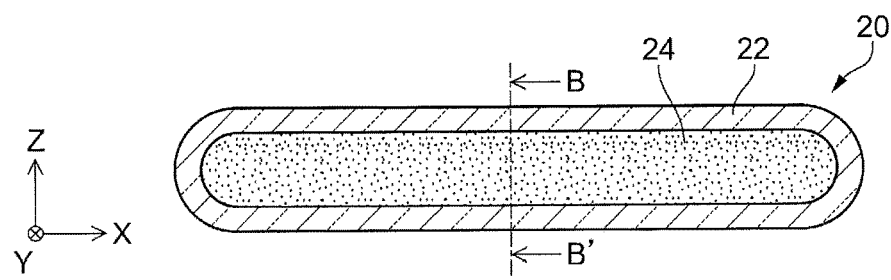
Figure 2C:
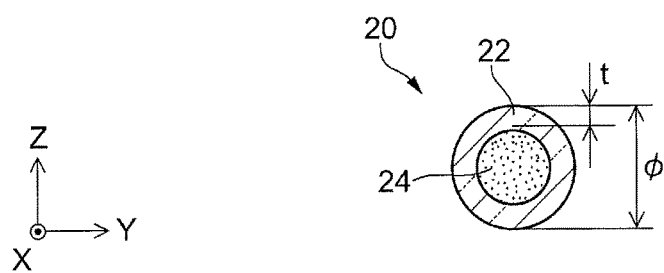

Subsequently, the gas cell according to the first embodiment and the ampoule used in the gas cell will be described with reference to FIGS. 2A to 2C. FIGS. 2A to 2C are schematic sectional views illustrating the configurations of the gas cell and the ampoule according to the first embodiment. Specifically, FIG. 2A is a schematic sectional view of the gas cell, FIG. 2B is a schematic sectional view of the ampoule, and FIG. 2C is a schematic cross-sectional view taken along line B-B' of FIG. 2B.

Configuration of Gas Cell

FIG. 2A illustrates the schematic section of the gas cell 10 according to the first embodiment. In FIG. 2A, the height direction of the gas cell 10 is referred to as a Z axis, and the upper side thereof is referred to as a +Z direction. The lengthwise direction of the gas cell 10 which is a direction that intersects the Z axis is referred to as an X direction, and the right side in FIG. 2A is referred to as a +X direction. In addition, the width direction of the gas cell 10 which is a direction that intersects the Z axis and the X axis is referred to as a Y axis, and the inner side from the front in the plane of FIG. 2A is referred to as a +Y direction.

As illustrated in FIG. 2A, the gas cell 10 according to the first embodiment is constituted by a cell portion 12 as a closed container, and a lid portion 19. The cell portion 12 is a box (cell) which is constituted by a plurality of walls 11 formed of quartz glass and has a void therein. The lid portion 19 is formed of quartz glass in a plate shape. As described above, it is preferable that the cell portion 12 and the lid portion 19 are formed of the same material. A sealing material 30, which will be described later, is disposed between the cell portion 12 and the lid portion 19. When the cell portion 12 and the lid portion 19 are formed of the same material, the two naturally have the same thermal expansion coefficient. Therefore, cracking of the sealing material 30 due to the difference in thermal expansion coefficient between the cell portion 12 and the lid portion 19 can be prevented.

The thickness of each of the walls 11 constituting the cell portion 12 is, for example, about 1.5 mm. The cell portion 12 includes, as the void included therein, a main chamber 14 as a first chamber, and a reservoir 16 as a second chamber. The main chamber 14 and the reservoir 16 communicate with each other through a communication hole 15 as a second hole. The inner diameter of the communication hole 15 is, for example, about 0.4 mm to 1 mm.

On the inner surface of each of the walls 11 constituting the cell portion 12 (the main chamber 14 and the reservoir 16), a coating layer 32 for enhancing non-relaxation characteristics is formed. The coating layer 32 covers the inner surfaces of the walls 11 of the main chamber 14 and the reservoir 16 and the inner surface of the lid portion 19. The coating layer 32 is formed of a chain saturated hydrocarbon such as a paraffin. As an example of the paraffin, for example, pentacontane having the chemical formula $CH_3(CH_2)_{48}CH_3$ may be used.

A portion of the wall 11 of the reservoir 16 of the cell portion 12 is provided with an opening 18 as a first hole. The opening 18 is provided at the tip end portion of the reservoir 16 on the side opposite to the main chamber 14. In other words, in the X-axis direction, the opening 18 is provided at the position farthest from the main chamber 14. The opening 18 is covered with the lid portion 19.

The sealing material 30 is disposed between the outer surface of the wall 11 of the cell portion 12 provided with the opening 18, and the lid portion 19. The opening 18 is sealed by the lid portion 19 with the sealing material 30 interposed therebetween. Accordingly, the cell portion 12 is sealed. As the material of the sealing material 30, for example, low-melting-point glass frit is used. The configuration of the periphery of the lid portion 19 (A section shown in FIG. 2A) will be described later in detail.

In a method of sealing the opening 18 with the lid portion 19 and the sealing material 30 as in this embodiment, compared to a method of blocking and sealing the opening 18 only with the sealing material 30 (Modification Example 1 described later), the sealing material 30 can be thinned. Therefore, cracking of the sealing material 30 due to the difference in thermal expansion coefficient between the sealing material 30 and the cell portion 12 or the lid portion 19 can be prevented.

Furthermore, in a configuration having the lid portion 19 as in this embodiment, the sealing material 30 is disposed between the lid portion 19 and the wall 11 in the periphery of (around) the opening 18, that is, on the outside of the cell portion 12 (the reservoir 16), and thus it becomes possible to allow the sealing material 30 to be distant from an alkali metal gas 13. In addition, since the lid portion 19 is disposed on the outside of the sealing material 30 to block the opening 18, the cell portion 12 can be more reliably sealed. Therefore, in the configuration having the lid portion 19 as in this embodiment, a chemical reaction between the alkali metal and the sealing material 30 can be more reliably suppressed, and thus the service life of the gas cell 10 can be further increased.

The alkali metal gas 13 is sealed in the main chamber 14 and the reservoir 16 of the cell portion 12. In the main chamber 14 and the reservoir 16 of the cell portion 12, in addition to the alkali metal gas 13, inert gas such as noble gas may also be present. An ampoule 20 is disposed in the reservoir 16. The alkali metal gas 13 results from vaporization (gasification) of an alkali metal solid 24 (see FIG. 2B) in the ampoule 20.

Configuration of Ampoule

FIG. 2B illustrates an X-Z section of the ampoule 20. As illustrated in FIG. 2B, the ampoule 20 is formed as a hollow glass tube 22. The glass tube 22 is, for example, formed of borosilicate glass.

The glass tube 22 extends along one direction (the X-axis direction in FIG. 2B), and both end portions thereof are welded. Accordingly, the glass tube 22 having the hollow inside is sealed. In addition, the shape of both end portions of the glass tube 22 is not limited to a round shape illustrated in FIG. 2B, and may also be a shape close to a flat surface, or a partially sharp shape.

The hollow inside of the glass tube 22 is filled with the alkali metal solid (a granular or powdery material having alkali metal atoms) 24. As the alkali metal solid 24, as described above, rubidium, potassium, or sodium may also be used other than cesium. FIG. 2B illustrates a state in which the ampoule 20 (the glass tube 22) is sealed. Since the alkali metal has high reactivity, in a stage in which the ampoule 20 is manufactured, the inside of the ampoule 20 is filled with the alkali metal solid 24, and the glass tube 22 is in a sealed state.

In a stage in which the gas cell 10 illustrated in FIG. 2A is completed, the ampoule 20 disposed in the gas cell 10 is in a state in which a through-hole 21 is formed in the glass tube 22 and the seal is broken. Accordingly, the alkali metal solid 24 in the ampoule 20 is vaporized and leaks into the gas cell 10 such that the inside of the main chamber 14 and the reservoir 16 of the cell portion 12 is filled with the alkali metal gas 13. In addition, so as to facilitate the vaporization and leakage of the alkali metal solid 24 from the inside of the ampoule 20, for example, a gap of about 1.5 mm is provided between the upper surface of the ampoule 20 and the inner surface of the cell portion 12.

FIG. 2C illustrates a Y-Z cross-section of the ampoule 20. As illustrated in FIG. 2C, the Y-Z cross-sectional shape of the glass tube 22 is, for example, a substantially circular shape, and may also be another shape. The outer diameter φ of the glass tube 22 is $0.2 \text{ mm} \leq \phi \leq 1.2 \text{ mm}$. The thickness t of the glass tube 22 is $0.1 \text{ mm} \leq t \leq 0.5 \text{ mm}$, and is preferably about 20% of the outer diameter φ thereof. When the thickness t of the glass tube 22 is smaller than 0.1 mm, the glass tube 22 is easily broken. When the thickness t of the glass tube 22 is greater than 0.5 mm, it is difficult to perform a process of forming the through-hole 21 in the glass tube 22 in a depth direction thereof.

Configuration of Periphery of Opening

Figure 3A:
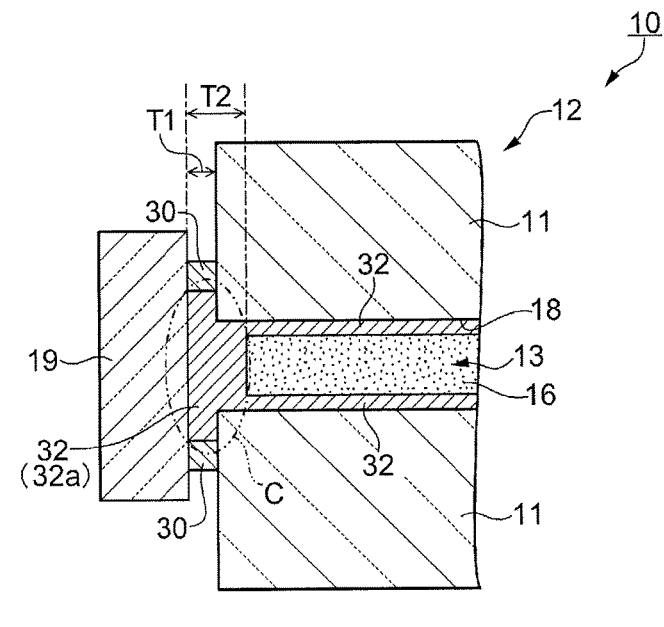
FIGS. 3A and 3B are schematic views illustrating the configuration of the periphery of an opening of the gas cell according to the first embodiment.
Figure 3B:
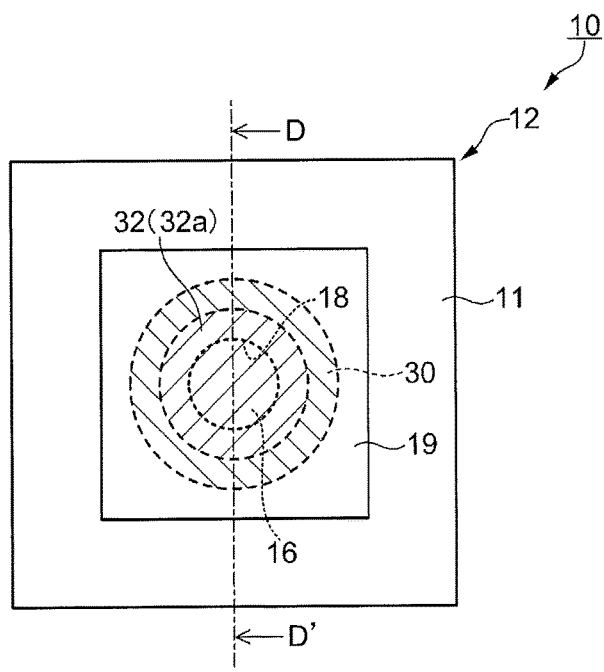
Figure 15:
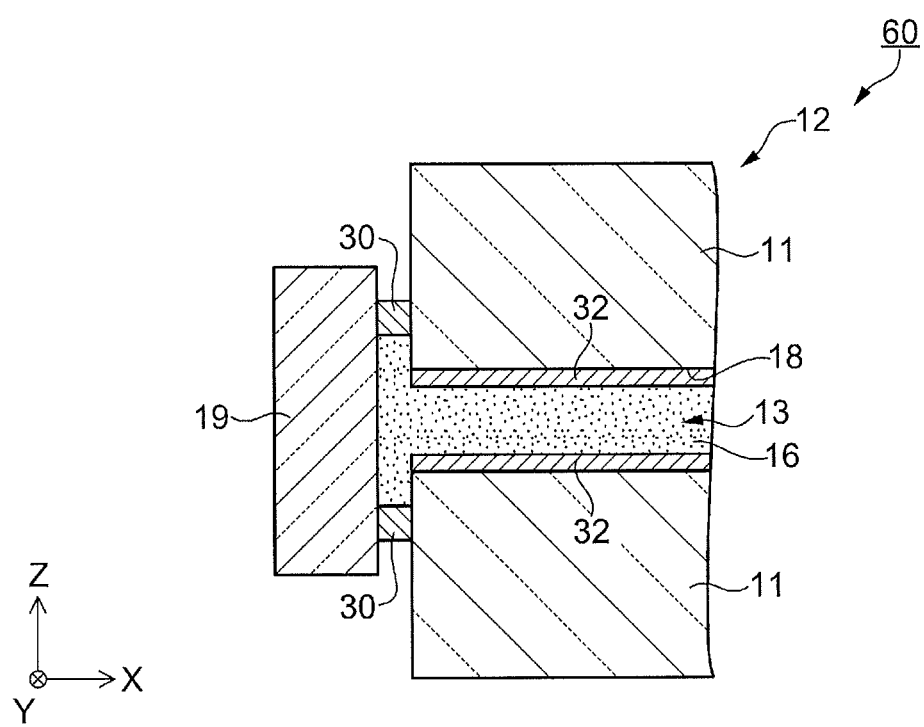
FIG. 15 is a schematic view illustrating the configuration of a lid portion of a gas cell as a comparative example.

Subsequently, the configuration of the periphery of the opening 18 will be described. FIGS. 3A and 3B are schematic views illustrating the configuration of the periphery of the opening of the gas cell according to the first embodiment. Specifically, FIG. 3A is an enlarged sectional view of the section A in FIG. 2A, and corresponds to a sectional view taken along line D-D' of FIG. 3A. FIG. 3B is an elevation view viewed from the side (−X direction) in FIG. 3A. FIG. 15 is a schematic view illustrating the configuration of a lid portion of a gas cell as a comparative example.

As illustrated in FIG. 3A, the sealing material 30 is disposed between the outer surface of the wall 11 of the cell portion 12 (the reservoir 16) provided with the opening 18, and the lid portion 19. As illustrated in FIG. 3B, the opening 18 is substantially circular in an elevation view viewed in the −X direction. The lid portion 19 is substantially rectangular in the elevation view. The sealing material 30 is disposed in an annular shape to surround the opening 18. The inner diameter of the sealing material 30 is greater than the outer diameter of the opening 18, and the outer diameter of the sealing material 30 is smaller than the external shape of the lid portion 19. On the inside of the sealing material 30 disposed in an annular shape, the coating layer 32 (coating material 32a) is disposed.

As illustrated in FIG. 3A, the coating layer 32 (the coating material 32a) is disposed to infiltrate between the outer surface of the wall 11 and the lid portion 19 from the inner surface of the wall 11 of the cell portion 12 (reservoir 16 side) and covers the inner surface of the sealing material 30 (indicated by the section C in FIG. 3A). The coating layer has a function of enhancing the non-relaxation characteristics of the cell portion 12 described above, and a function of suppressing a chemical reaction between the alkali metal having high reactivity and the sealing material 30 by not allowing the sealing material 30 to come into contact with the alkali metal gas 13.

As in a gas cell 60 illustrated in FIG. 15 as a comparative example, in a case where the coating layer 32 is disposed only on the inner surface of the wall 11 of the cell portion 12 and does not cover the inner surface of the sealing material 30, the alkali metal gas 13 (the alkali metal) and the material (low-melting-point glass frit) of the sealing material 30 come into contact with each other, and there is concern that the two may cause a chemical reaction.

When the alkali metal gas 13 (the alkali metal) and the material of the sealing material 30 cause a chemical reaction, the amount of the alkali metal gas 13 in the cell portion 12 decreases due to a chemical change in the alkali metal, and the alkali metal gas 13 leaks to the outside of the cell portion 12 due to the deterioration in the seal caused by a chemical change in the sealing material 30. As a result, there is concern that the manufacturing yield of the gas cell 60 and a magnetism measuring device 100 provided with the gas cell 60 may be reduced or there is concern that the sensitivity of the magnetism measuring device 100 may not be maintained for a long period of time due to a reduction in the service life of the gas cell 60.

Contrary to this, in the gas cell 10 according to the first embodiment, as illustrated in FIG. 3A, the sealing material 30 is protected from the alkali metal gas 13 sealed in the cell portion 12 by covering the inner surface of the sealing material 30 with the coating layer 32. Therefore, the sealing material 30 does not come into contact with the alkali metal gas 13, and a chemical reaction between the alkali metal and the sealing material 30 can be suppressed. Accordingly, a reduction in the amount of the alkali metal gas 13 due to a chemical change in the alkali metal, and leakage of the alkali metal gas 13 due to the deterioration in the seal caused by a chemical change in the sealing material 30 are prevented. Therefore, the sensitivity of the magnetism measuring device 100 provided with the gas cell 10 can be maintained for a long period of time.

In FIG. 3A, When the thickness in the X-axis direction of the sealing material 30 is T1, 3 μm≤T1≤20 μm is preferable, and T1=5 μm to 6 μm is more preferable. When the thickness T1 of the sealing material 30 is 3 μm or greater, the sealing material 30 can be substantially uniformly disposed in each portion of the annular shape in the elevation view between the outer surface of the wall 11 of the cell portion 12 and the lid portion 19, and thus the cell portion 12 and the lid portion 19 can be properly attached to each other. On the other hand, when the thickness T1 of the sealing material 30 is 20 μm or smaller, even though there is a difference in thermal expansion coefficient between quartz glass (the cell portion 12 and the lid portion 19) and the low-melting-point glass frit (the sealing material 30) with change in the temperature, breaking (cracking) of the sealing material 30 is prevented.

When the thickness in the X-axis direction of the coating layer 32 is T2 in the section C in FIG. 3A, the thickness T2 is preferably 100 μm or greater, and may be 1 mm or greater. By allowing the thickness T2 of the coating layer 32 to be 100 μm or greater, which is greater than the thickness T1 of the sealing material 30, the inner surface of the sealing material 30 can be reliably covered with the coating layer 32 and can be protected from the alkali metal gas 13. In addition, as the thickness T2 of the coating layer 32 increases, the distance between the alkali metal gas 13 and the sealing material 30 can be increased. Therefore, the diffusion of metal atoms (cesium or the like) of the alkali metal gas 13 in the coating layer 32 to the sealing material 30 can be effectively suppressed.

The thickness of the coating layer 32 disposed on the inner surface of the walls 11 constituting the cell portion 12 (the main chamber 14 and the reservoir 16) may be, for example, 100 nm or smaller. Therefore, in the first embodiment, the thickness T2 of the coating layer 32 disposed in the section C in FIG. 3A is set to be significantly greater than the thickness of the coating layer 32 disposed on the inner surface of the walls 11 constituting the cell portion 12.

Manufacturing Method of Gas Cell

Figure 6:
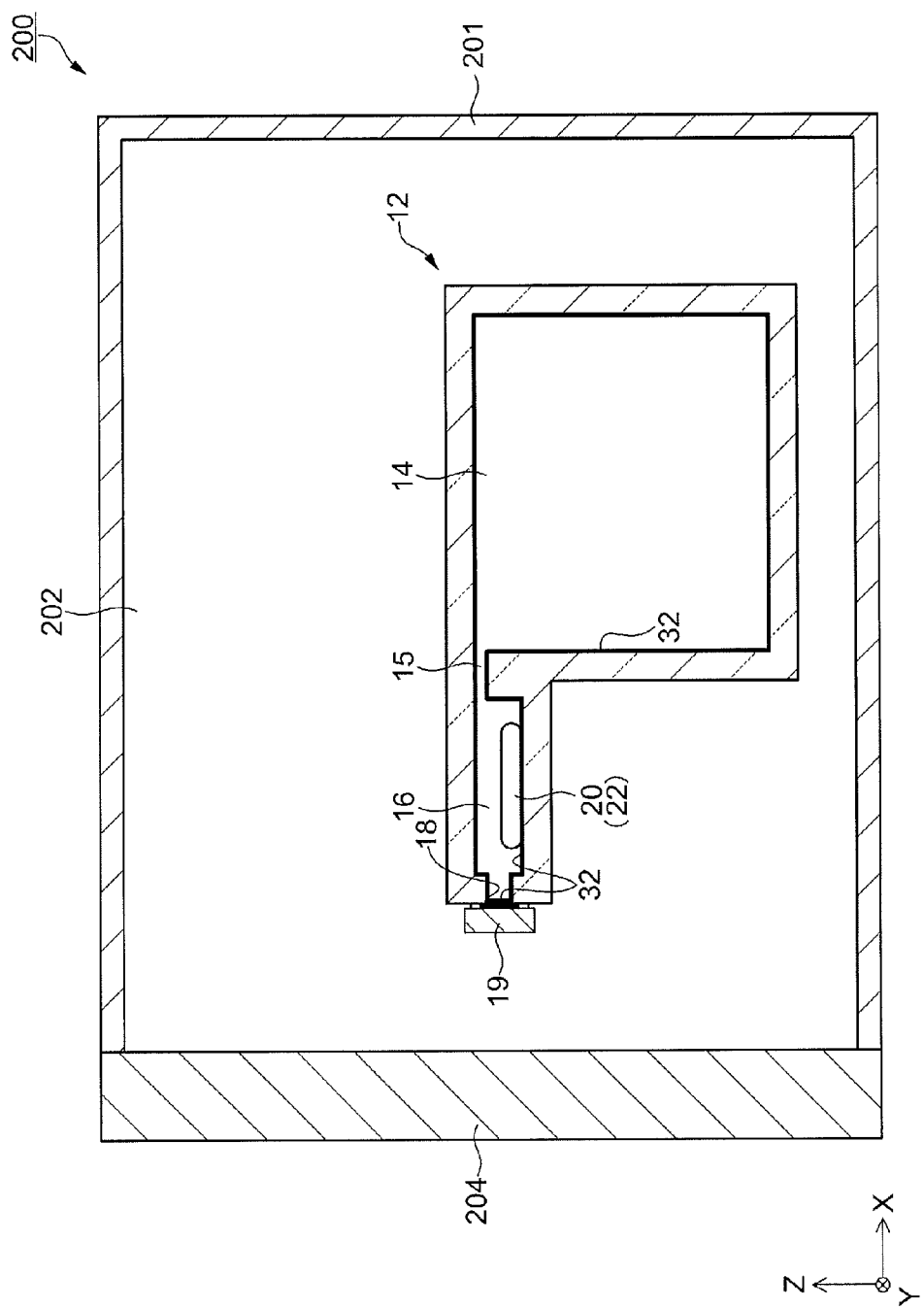
FIG. 6 is a view illustrating a heating process and a cooling process according to the first embodiment.
Figure 7:
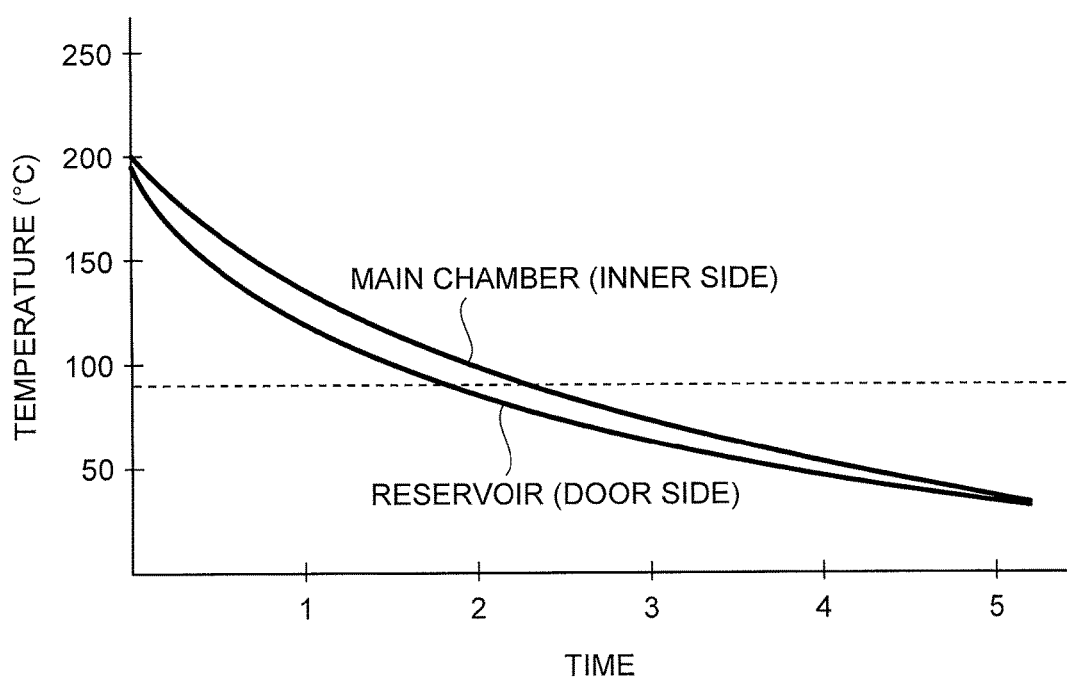
FIG. 7 is a view illustrating an example of a temperature change during the cooling process according to the first embodiment.

Next, a manufacturing method of the gas cell according to the first embodiment will be described with reference to FIGS. 4A to 7. The manufacturing method of the gas cell according to the first embodiment includes a forming process, a sealing process, a heating process, and a cooling process. FIGS. 4A to 5C are views illustrating the manufacturing method of the gas cell according to the first embodiment. FIG. 6 is a view illustrating the heating process and the cooling process according to the first embodiment. FIG. 7 is a view illustrating an example of a temperature change during the cooling process according to the first embodiment.

Figure 4A:
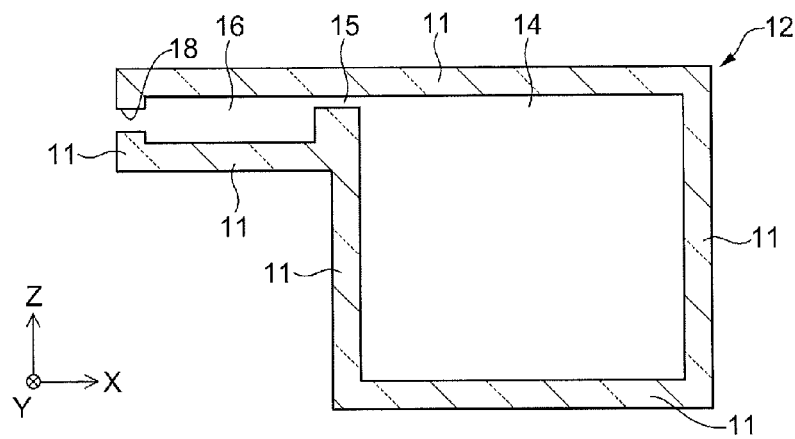
FIGS. 4A to 4C are views illustrating a manufacturing method of the gas cell according to the first embodiment.
Figure 4B:
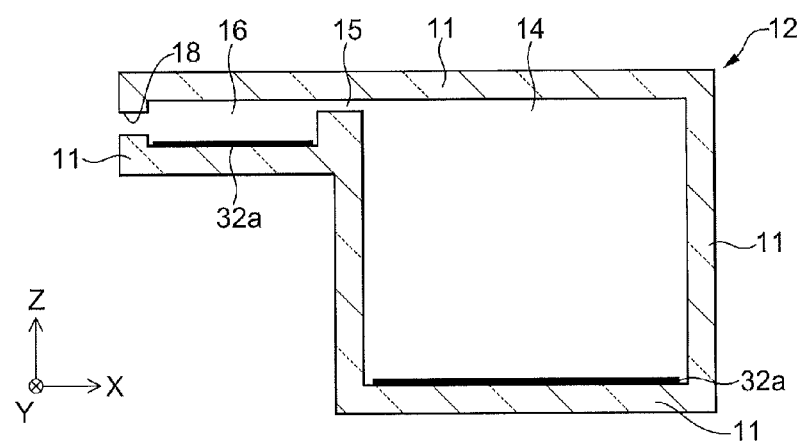
Figure 4C:
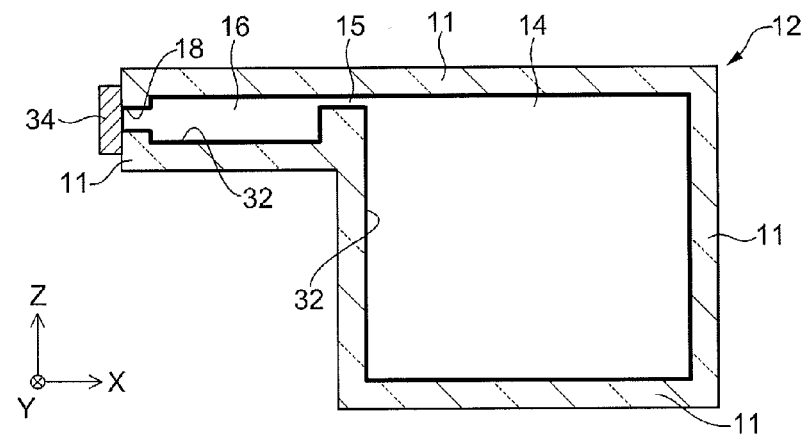

FIGS. 4A to 4C illustrate the forming process. In the forming process, first, the cell portion 12 illustrated in FIG. 4A is formed. Although not illustrated, for example, by cutting a glass plate made of quartz glass, a plurality of glass plate members corresponding to the walls 11 constituting the cell portion 12 are prepared. In addition, the glass plate members are assembled, and the glass plate members are joined together by an adhesive or welding, thereby forming the cell portion 12 having the main chamber 14 and the reservoir 16. In the formed cell portion 12, the opening 18 is formed in a portion of the wall 11 of the reservoir 16 on the side opposite to the main chamber 14. In this stage, the opening 18 is open.

Subsequently, the coating layer 32 is formed on the inner surface of each of the walls 11 constituting the cell portion 12 (the main chamber 14 and the reservoir 16). The inside of the cell portion 12 is sufficiently evacuated beforehand, and in a state in which an extremely small amount of impurities are present in an environment in the cell portion 12 and in the periphery of the cell portion 12, as illustrated in FIG. 4B, the coating material 32a (chain saturated hydrocarbon) which is the material of the coating layer 32 is disposed in the cell portion 12. The coating material 32a is disposed in the main chamber 14 and the reservoir 16 in the cell portion 12 through the opening 18, for example, using a needle or the like. Otherwise, while the inside of the cell portion 12 is in a vacuum, the coating material 32a (chain saturated hydrocarbon) may be heated and introduced into the cell portion 12 through the opening 18 in a gas state or a liquid state.

As illustrated in FIG. 4C, the opening 18 is blocked by a temporary lid 34, and the cell portion 12 and the coating material 32a disposed therein are heated to a first temperature. The first temperature will be described in detail in the subsequent heating process. During the heating, the coating material 32a (chain saturated hydrocarbon) is melted, and the coating layer 32 which is a film of the coating material 32a (chain saturated hydrocarbon) is formed on the inner surface of each of the walls 11 constituting the cell portion 12 (the main chamber 14 and the reservoir 16).

Figure 5A:
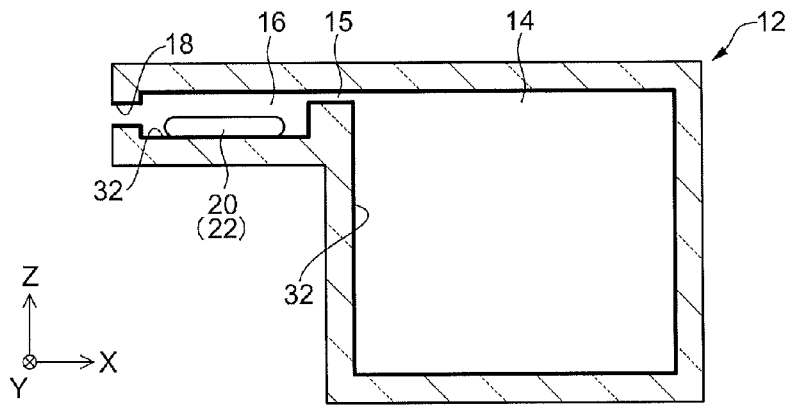
FIGS. 5A to 5C are views illustrating the manufacturing method of the gas cell according to the first embodiment.

Subsequently, as illustrated in FIG. 5A, the ampoule 20 is accommodated in the reservoir 16 of the cell portion 12 having the coating layer 32 formed on the inner surface thereof. The ampoule 20 is inserted through the opening 18 provided in the cell portion 12 on the reservoir 16 side and is disposed in the reservoir 16. In this stage, as illustrated in FIG. 2B, the ampoule 20 is in a state of being filled with the alkali metal solid 24 in the hollow glass tube 22 and sealed.

The ampoule 20 is formed by filling the hollow of the tubular glass tube 22 with the alkali metal solid 24 in an atmosphere at a low pressure close to vacuum (ideally, in a vacuum) and welding and sealing both end portions of the glass tube 22. The alkali metal such as cesium used as the alkali metal solid 24 has high reactivity and cannot be treated in the air, and is thus accommodated in the cell portion 12 in a state of being sealed in the ampoule 20 in the environment at a low pressure.

Figure 5B:
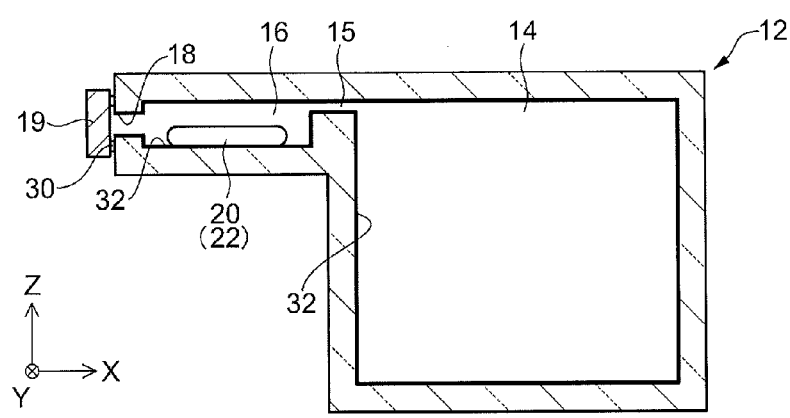

FIG. 5B is a view illustrating the sealing process. The inside of the cell portion 12 illustrated in FIG. 5A is sufficiently evacuated, and in a state where an excessively small amount of impurities is present in the main chamber 14 and the reservoir 16, the cell portion 12 is sealed as illustrated in FIG. 5B. For example, in the environment at a low pressure closer to vacuum (ideally, in a vacuum) or in an inert gas, the opening 18 of the cell portion 12 is sealed by the lid portion 19 using the sealing material 30 (low-melting-point glass frit). Accordingly, the cell portion 12 is sealed in a state of accommodating the ampoule 20 therein.

Subsequently, the heating process of heating the cell portion 12 sealed by the lid portion 19 using the sealing material 30, and the cooling process of reducing the temperature of the temperature of the cell portion 12 after the heating process are performed. The heating process is performed for the purpose of melting the material (chain saturated hydrocarbon) of the coating layer 32 again to uniformize the film thickness of the coating layer 32 on the inner surface of the cell portion 12. In addition, the cooling process is performed for the purpose of fixing the coating layer 32 to the inner surface of the cell portion 12 and allowing the material of the coating layer 32 to precipitate to the section C shown in FIG. 3A.

During the heating process and the cooling process, as illustrated in FIG. 6, the closed cell portion 12 is disposed in an interior 202 of an oven 200 having a body 201 and a door 204. The cell portion 12 is disposed so that the main chamber 14 is positioned on the inner side (+X direction side in FIG. 6) of the interior 202 and the reservoir 16 is positioned on the door 204 side (−X direction side in FIG. 6).

In the heating process, the interior 202 of the oven 200 in which the cell portion 12 is disposed is heated to the first temperature, which is higher than the melting point of the material (chain saturated hydrocarbon) of the coating layer 32 and is as high as a thermal decomposition temperature or lower. As the first temperature increases, the amount of the chain saturated hydrocarbon per unit volume in a gas phase increases, and a large amount of the material of the coating layer 32 precipitates to the periphery of the opening 18 when a second temperature that is lower than the first temperature is reached in the subsequent cooling process, which is preferable.

In an inert atmosphere (for example, nitrogen or argon atmosphere) in which a small amount of oxygen or water vapor is present, a hydrocarbon generally starts to thermally decompose from a temperature of about 300° C. Specifically, the thermal decomposition of the chain saturated hydrocarbon significantly occurs from a temperature of about 400° C. within a heating process time of several minutes in the inert atmosphere, and the thermal decomposition thereof is not recognized at a temperature of about 350° C. As a matter of course, when the heating process time increases, the thermal decomposition thereof is recognized even at a temperature of 350° C.

In this embodiment, a single type of alkali metal gas, or a gas mixture of an alkali metal gas and an inert gas is sealed in the cell portion 12, and the heating process time is about several minutes to several hours. The alkali metal gas rarely interacts with a paraffin and thus acts as an inert gas to the paraffin. Therefore, when the heating process time in the inert gas is in the above range and the first temperature is 350° C. or lower, the thermal decomposition of the chain saturated hydrocarbon occurs without any theoretical problems.

However, the chain saturated hydrocarbon has a molecular weight distribution, and thus the thermal decomposition start temperature of the chain saturated hydrocarbon also has a distribution. Therefore, in consideration of the distribution of the thermal decomposition start temperature, from the viewpoint of stable manufacturing, the first temperature is preferably 250° C. or lower. In the case of this embodiment, since pentacontane is used as the chain saturated hydrocarbon, it is preferable that the first temperature is equal to or higher than 91° C., which is the melting point of the pentacontane, and is as high as 350° C. or lower. In this embodiment, the first temperature during the heating process is set to 200° C.

Here, the boiling point of pentacontane at 1 atmosphere is 575° C. However, since the melting point has pressure dependence, the boiling point of the pentacontane under a vacuum at about 1 Torr (133 Pa) becomes about 320° C., and the boiling point of the pentacontane under a vacuum at about 10 mTorr (1.33 Pa) becomes about 230° C. In this embodiment, the heating process is performed under a reduced pressure of about 1 Torr (133 Pa) or lower, the boiling point of the pentacontane is reduced to about 320° C. or lower. Therefore, when the first temperature is 200° C., the first temperature becomes a temperature close to the boiling point of the pentacontane, and the heating process can be efficiently completed within a short time.

In addition, the first temperature in the process of forming the coating layer 32 (see FIG. 4C) described above also corresponds to the first temperature during the above-described heating process.

In the subsequent cooling process, the interior 202 of the oven 200 in which the cell portion 12 is disposed is cooled to a second temperature, which is lower than the first temperature. The second temperature may be a temperature that is lower than the melting point of the chain saturated hydrocarbon. In the case of this embodiment, since the pentacontane is used as the chain saturated hydrocarbon, the second temperature may be lower than 91° C.

In general, the temperature of the interior 202 of the oven 200 on the door 204 side during the heating process tends to be lower than that on the inner side, and the temperature of the interior 202 on the door 204 side even during the cooling process is more likely to decrease than on the inner side. In addition, the cross-sectional area on the Y-Z plane of the reservoir 16 is smaller than the cross-sectional area on the Y-Z plane of the main chamber 14. That is, in the cell portion 12, the cross-sectional area of the reservoir 16 positioned on the door 204 side is smaller than the cross-sectional area on the Y-Z plane of the main chamber 14 positioned on the inner side of the interior 202.

Therefore, when the temperature of the interior 202 is decreased, as in an example illustrated in FIG. 7, the temperature of the reservoir 16 positioned on the door 204 side more rapidly decreases than the temperature of the main chamber 14 positioned on the inner side of the interior 202. In addition, even in the reservoir 16, the temperature of the periphery of the lid portion 19 (the opening 18) positioned at the tip end portion closest to the door 204 side is more likely to decrease than that of the other parts.

Therefore, during the cooling process, the temperature of the periphery of the lid portion 19 (the opening 18) reaches a temperature of less than the melting point of the chain saturated hydrocarbon faster than the temperature of the other parts, and thus the melted material (the chain saturated hydrocarbon) of the coating layer 32 starts to precipitate to the periphery of the lid portion 19 (the opening 18). As a result, the amount of the material of the coating layer 32 precipitated to the section C shown in FIG. 3A becomes greater than that of the other parts, and thus the coating layer 32 can be disposed to infiltrate between the outer surface of the wall 11 of the cell portion 12 and the lid portion 19 and cover the inner surface of the sealing material 30.

Figure 5C:
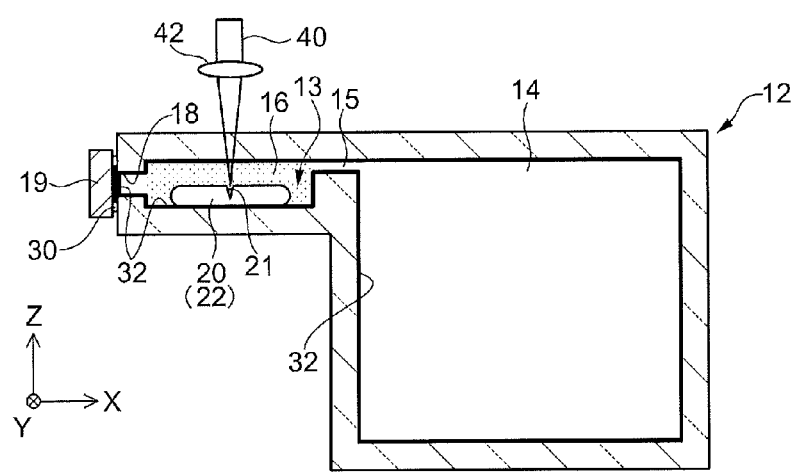

Subsequently, as illustrated in FIG. 5C, the through-hole 21 is formed in the ampoule 20 (the glass tube 22). In this process, pulsed laser light 40 is concentrated on a condensing lens 42, and irradiates the glass tube 22 of the ampoule 20 through the cell portion 12 from the upper side (+Z direction). Since laser light has excellent directivity and convergence, the glass tube 22 can be easily processed. By emitting the pulsed laser light 40 thereto, processing performed in a depth direction (−Z direction) from the upper surface (surface) of the glass tube 22 proceeds. In addition, when the through-hole 21 is formed in the glass tube 22, the hollow portion of the ampoule 20 communicates with the reservoir 16 and the seal of the ampoule 20 is broken.

By forming the through-hole 21 in the glass tube 22, the alkali metal solid 24 (see FIG. 2B) in the ampoule 20 is vaporized, is transitioned into the alkali metal gas 13, and leaks to the inside of the reservoir 16. The alkali metal gas 13 that leaks to the inside of the reservoir 16 flows into the main chamber 14 of the cell portion 12 through the communication hole 15 and diffuses. As a result, as illustrated in FIG. 2A, the inside of the main chamber 14 of the cell portion 12 is filled with the alkali metal gas 13. In the above-mentioned processes, the gas cell 10 can be manufactured.

As described above, in the first embodiment, by decreasing the temperature of the periphery of the lid portion 19 (the opening 18) more rapidly than the temperature of the other parts during the cooling process, the amount of the material (the chain saturated hydrocarbon) of the coating layer 32 precipitated to the periphery of the opening 18 can be more than that of the other parts. In addition, by covering the inner surface of the sealing material 30 with the coating layer 32, a chemical reaction between the alkali metal (the alkali metal gas 13) and the sealing material 30 is suppressed.

Therefore, according to the configuration of the gas cell and the manufacturing method of the gas cell according to the first embodiment, the manufacturing yield of the gas cell 10 can be enhanced, and the service life of the gas cell 10 can be increased. In addition, since the coating layer 32 for enhancing the non-relaxation characteristics of the cell portion 12 is used to protect the sealing material 30, an additional material or process for covering the surface of the sealing material 30 is not necessary. Therefore, without a reduction in productivity or an increase in production costs, the gas cell 10 which has a small size and a long service life can be stably manufactured.

The manufacturing method of a magnetism measuring device according to the first embodiment includes the manufacturing method of the gas cell described above. Therefore, a magnetism measuring device 100 which can maintain its sensitivity for a long period of time can be stably manufactured. In addition, regarding a process of manufacturing the magnetism measuring device 100 according to the first embodiment, well-known methods can be used in processes other than the process of manufacturing the gas cell 10, and thus the description thereof will be omitted.

Second Embodiment

In a second embodiment, the configuration of a gas cell is the same as that in the first embodiment, and a manufacturing method of the gas cell is partially different from that in the first embodiment. More specifically, the second embodiment is different from the first embodiment in that a partition plate is used in a cooling process during the manufacturing of the gas cell. The difference in the cooling process from the first embodiment is described herein.

Manufacturing Method of Gas Cell

Figure 8:
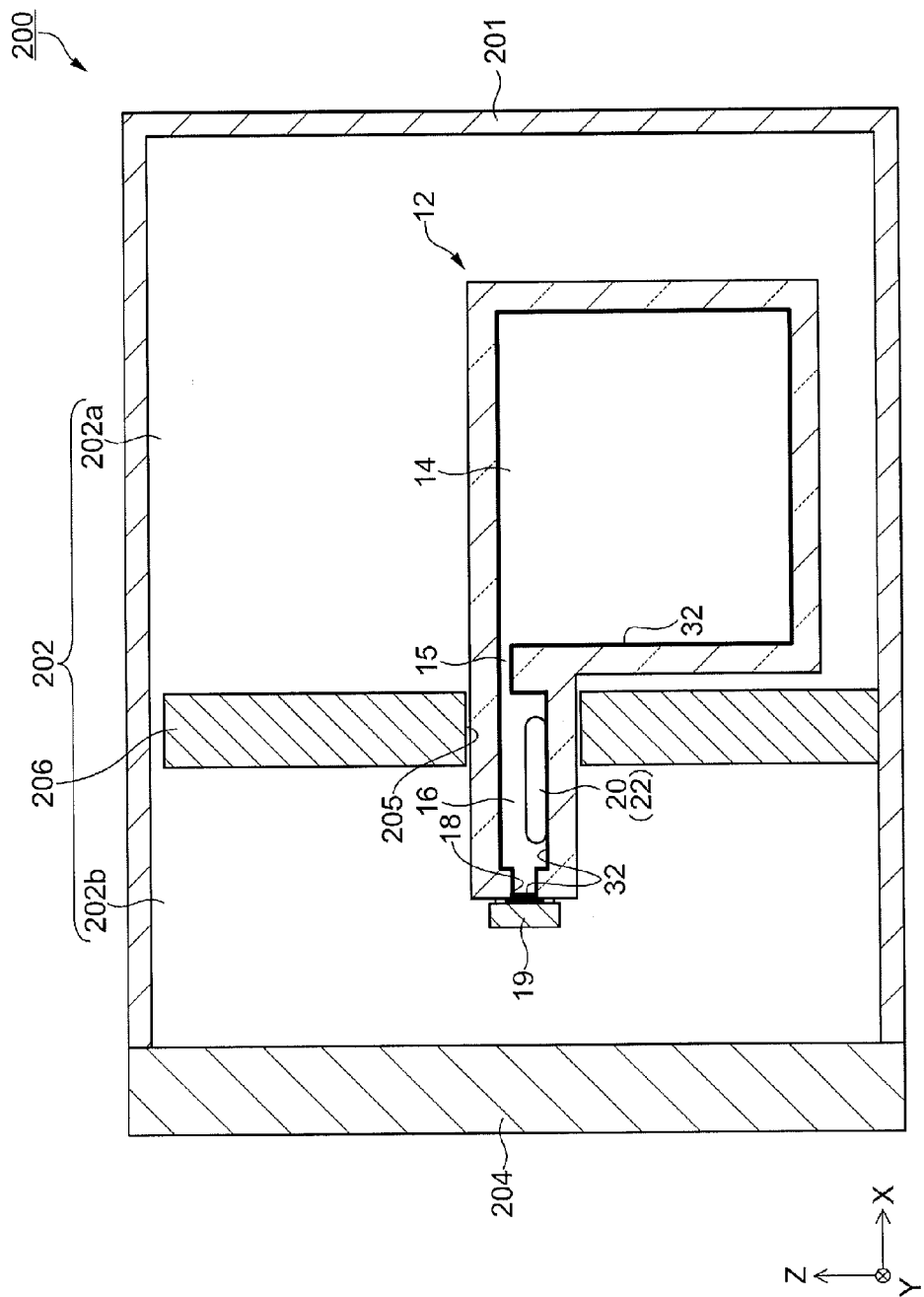
FIG. 8 is a view illustrating a heating process and a cooling process according to a second embodiment.

FIG. 8 is a view illustrating a heating process and the cooling process in the manufacturing method of the gas cell according to the second embodiment. As illustrated in FIG. 8, the heating process and the cooling process according to the second embodiment are different from those of the first embodiment in that a partition plate 206 which partitions the interior 202 of the oven 200 into a first portion 202a on the inner side (+X direction side in FIG. 8) and a second portion 202b on the door 204 side.

The partition plate 206 is formed as a plate-like member. The partition plate 206 is provided for the purpose of causing a temperature difference between the two portions by suppressing a flow of air between the first portion 202a and the second portion 202b in the interior 202 of the oven 200 during the heating process and the cooling process. Therefore, since the partition plate 206 only needs to suppress the flow of air between the first portion 202a and the second portion 202b, the outer diameter of the partition plate 206 may be smaller than the inner diameter of the interior 202. The material of the partition plate 206 is not limited as long as the material can withstand a high temperature (about 350° C.) during the heating process.

The partition plate 206 is provided with a through-hole 205 having a diameter larger than the outer diameter of the reservoir 16 in a portion in which the reservoir 16 is positioned when the cell portion 12 is disposed in the interior 202. During the heating process and the cooling process, the cell portion 12 is disposed so that the main chamber 14 is positioned in the first portion 202a which is closer to the inner side than the partition plate 206, and the tip end side of the reservoir 16 passes through the through-hole 205 and is positioned in the second portion 202b which is closer to the door side 204 than the partition plate 206.

Figure 9:
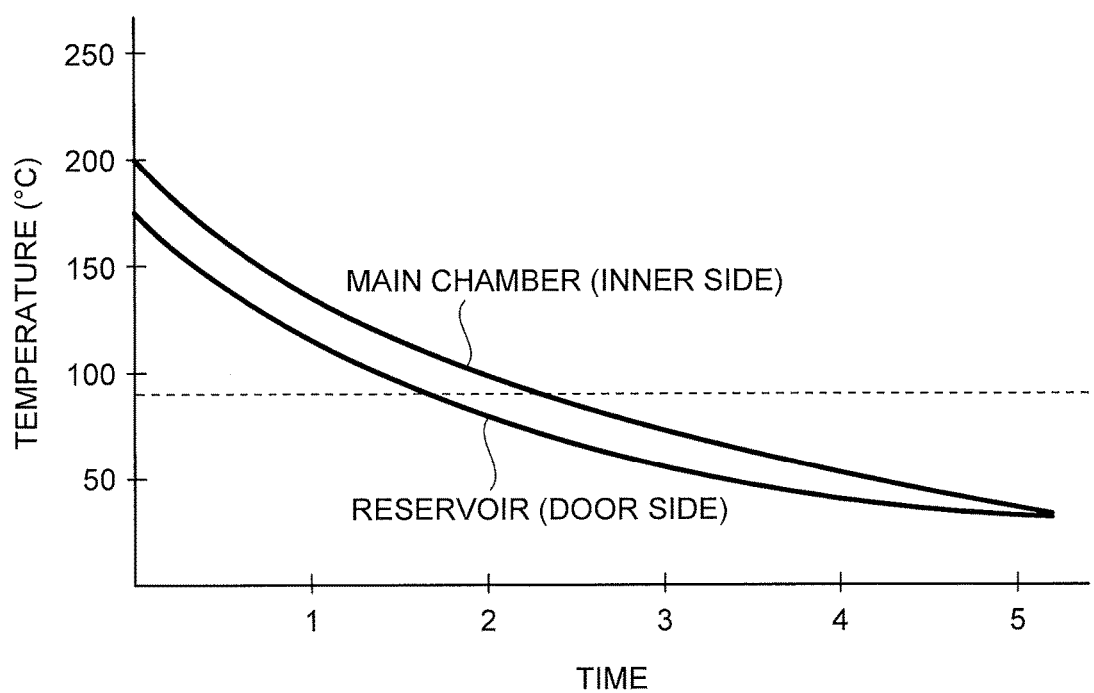
FIG. 9 is a view illustrating an example of a temperature change during the cooling process according to the second embodiment.

FIG. 9 is a view illustrating an example of a temperature change during the cooling process according to the second embodiment. As in the example illustrated in FIG. 9, even when the interior 202 of the oven 200 is heated during the heating process and the temperature of the main chamber 14 positioned in the first portion 202a on the inner side is increased to 200° C., the temperature of the reservoir 16 positioned in the second portion 202b on the door 204 side is lower than 200° C.

During the cooling process, the temperature of the interior 202 is decreased in a state in which there is a temperature difference between the first portion 202a and the second portion 202b. Therefore, compared to the first embodiment, the temperature of the reservoir 16 positioned on the door 204 side decrease more rapidly than the temperature of the main chamber 14 positioned on the inner side of the interior 202. In addition, the temperature of the periphery of the lid portion 19 (the opening 18) on the tip end side of the reservoir 16 rapidly reaches a temperature of less than the melting point of the chain saturated hydrocarbon.

As a result, the amount of the material of the coating layer 32 precipitated to the section C shown in FIG. 3A is further increased, and thus the coating layer 32 can be formed to more reliably cover the inner surface of the sealing material 30.

Third Embodiment

Figure 10A:
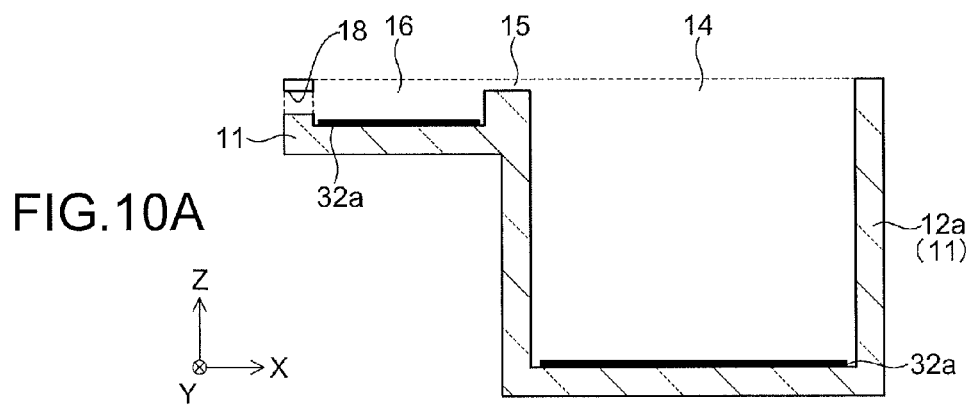
FIGS. 10A to 10C are views illustrating a forming process according to a third embodiment.
Figure 10B:
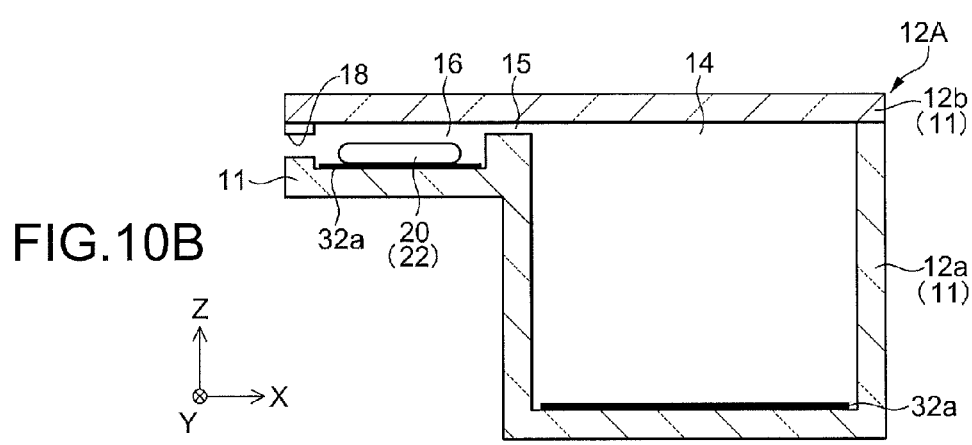
Figure 10C:
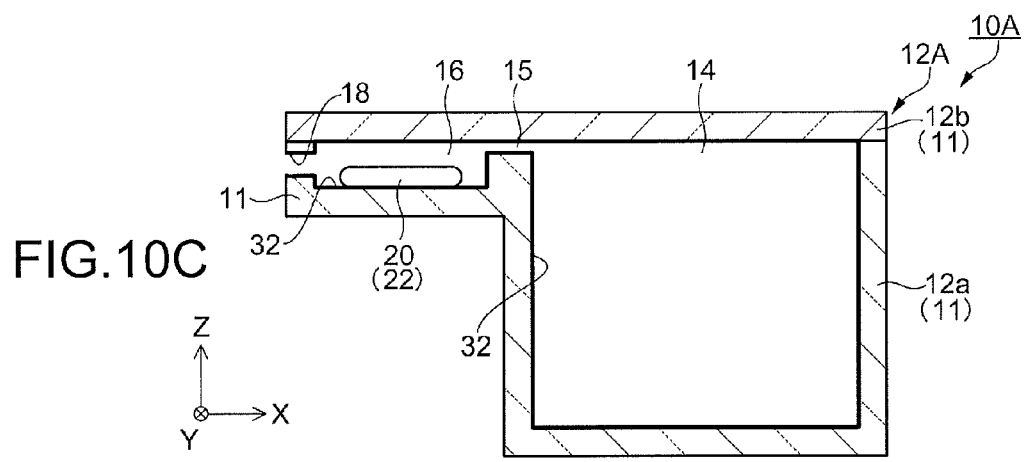

In a third embodiment, the configuration of a gas cell is partially different from those of the above-described embodiments, and accordingly a forming process in a manufacturing method of the gas cell is different therefrom. The difference in the configuration of the gas cell and the forming process from the above-described embodiments is described herein. FIGS. 10A to 10C are views illustrating the forming process according to the third embodiment.
Configuration of Gas Cell FIG. 10C illustrates a gas cell 10A when the forming process according to the third embodiment is ended. As illustrated in FIG. 10C, the gas cell 10A according to the third embodiment is constituted by a cell portion 12A as a closed container, and the lid portion 19 (see FIG. 2A) which is the same as that in the above-described embodiments. The cell portion 12A includes a concave container body 12a, and an upper lid 12b positioned on the upper side of the container body 12a. The container body 12a includes a concave portion which is to become the main chamber 14, and a concave portion which is to become the reservoir 16. A portion of the walls 11 of the concave portion which is to become the reservoir 16 of the container body 12a is provided with the opening 18 as a first hole.
Manufacturing Method of Gas Cell In the forming process of the gas cell according to the third embodiment, as illustrated in FIG. 10A, a plurality of glass plate members corresponding to the walls 11 constituting the cell portion 12A (the container body 12a and the upper lid 12) are prepared. The glass plate members are assembled, and the glass plate members are joined together by an adhesive or welding, thereby forming the container body 12a. The coating material 32a, which is the material (chain saturated hydrocarbon) of the coating layer 32, is disposed in the concave portion which is to become the main chamber 14 and in the concave portion which is to become the reservoir 16.

Subsequently, as illustrated in FIG. 10B, the ampoule 20 is accommodated in the concave portion, which is to become the reservoir 16. The upper lid 12b is joined to the upper side of the container body 12a by an adhesive or welding. Accordingly, the cell portion 12A having the main chamber 14 and the reservoir 16 is formed.

Subsequently, as in the above-described embodiments, the opening 18 is blocked by the temporary lid 34 (see FIG. 4C), and the cell portion 12A and the coating material 32a disposed therein are heated to the first temperature. Accordingly, as illustrated in FIG. 10C, the coating layer 32 which is a film of the coating material 32a (chain saturated hydrocarbon) is formed on the inner surface of each of the walls 11 constituting the cell portion 12A (the main chamber 14 and the reservoir 16).

Thereafter, as in the above-described embodiments, the inside of the cell portion 12A is sufficiently evacuated, and the sealing process illustrated in FIG. 5B, the heating process and the cooling process illustrated in FIG. 6 or 8, and the process of forming the through-hole 21 in the ampoule 20 illustrated in FIG. 5C are performed. Accordingly, the gas cell 10A having the cell portion 12A in which the coating layer 32 is disposed to cover the inner surface of the sealing material 30 can be manufactured.

In the third embodiment, the coating material 32A is disposed and the ampoule 20 is accommodated in a state in which the upper side of the concave container body 12a is open, and thus the disposition of the coating material 32a and the accommodation of the ampoule 20 can be easily performed. In addition, in the third embodiment, compared to the method of inserting the ampoule 20 through the opening 18 in the above-described embodiments, the ampoule 20 can be easily disposed at a desired position in the reservoir 16.

In addition, the joining method used when the upper lid 12b is joined to the upper side of the container body 12a illustrated in FIG. 10B is not limited to the adhesive or welding, and the sealing material 30 may be disposed to join the two. In a case of joining the container body 12a to the upper lid 12b with the sealing material 30, the surface of the sealing material 30 is also covered with the coating layer 32 formed on the inner surface of each of the walls 11 constituting the cell portion 12A. Accordingly, the sealing material 30 for joining the container body 12a to the upper lid 12b can be protected from the alkali metal gas 13.

Fourth Embodiment

Figure 11A:
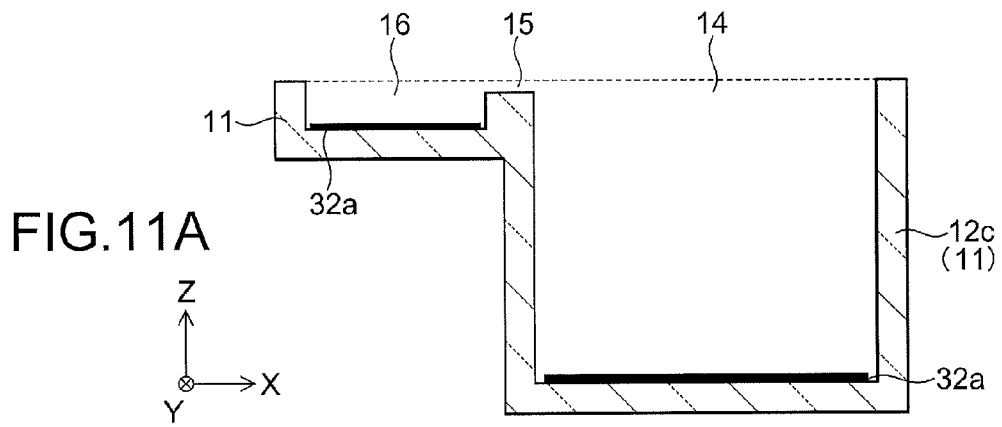
FIGS. 11A to 11C are views illustrating a forming process according to a fourth embodiment.
Figure 11B:
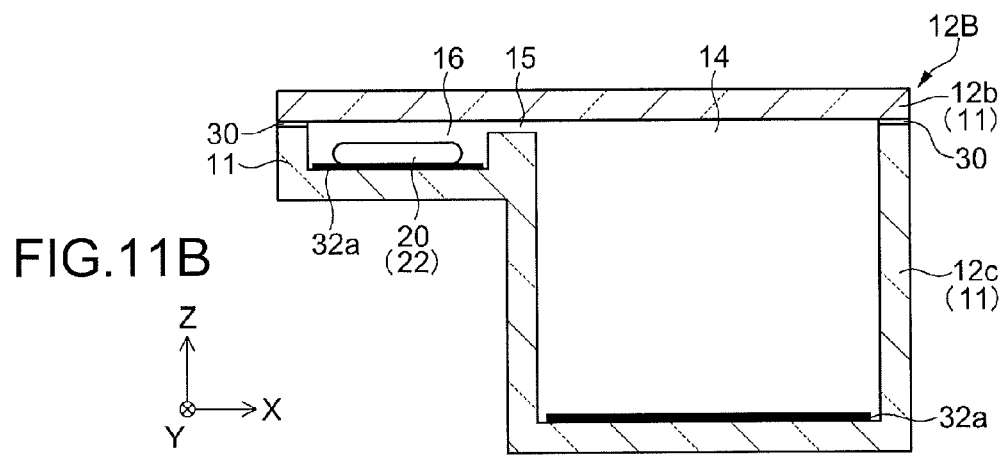
Figure 11C:
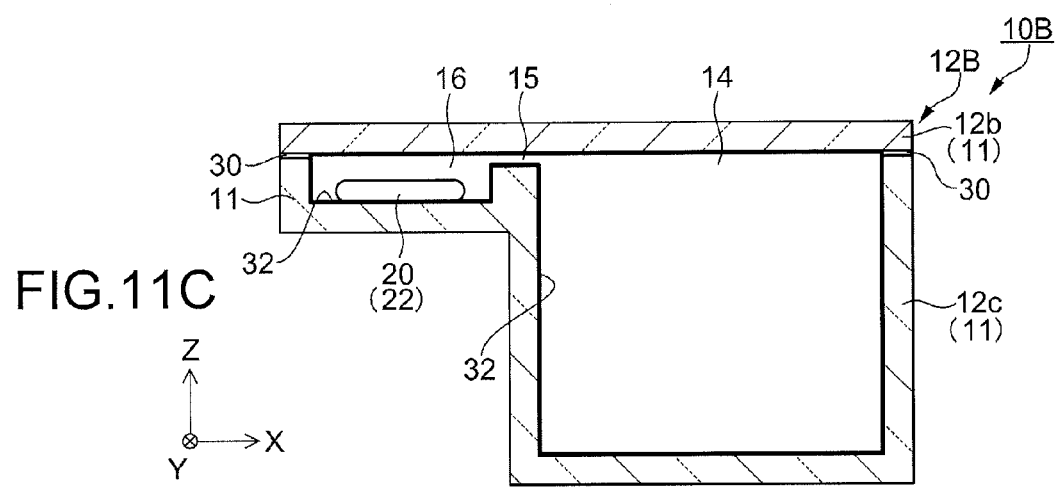

In a fourth embodiment, the configuration of a gas cell is partially different from those of the above-described embodiments, and accordingly a forming process in a manufacturing method of the gas cell is different therefrom. The difference in the configuration of the gas cell and the forming process from the above-described embodiments is described herein. FIGS. 11A to 11C are views illustrating the forming process according to the fourth embodiment.
Configuration of Gas Cell FIG. 11C illustrates a gas cell 10B when the forming process according to the fourth embodiment is ended. As illustrated in FIG. 11C, the gas cell 10B according to the fourth embodiment does not include the lid portion 19 unlike the above-described embodiments, and a cell portion 12B is formed as a closed container including a concave container body 12c, which does not include the opening 18, and the upper lid 12b.

Manufacturing Method of Gas Cell

In the forming process of the gas cell according to the fourth embodiment, as illustrated in FIG. 11A, glass plate members are assembled and joined together, thereby forming the container body 12c including a concave portion which is to become the main chamber 14, and a concave portion which is to become the reservoir 16. In addition, the coating material 32a, which is the material (chain saturated hydrocarbon) of the coating layer 32, is disposed in the concave portion which is to become the main chamber 14 and in the concave portion which is to become the reservoir 16.

Subsequently, as illustrated in FIG. 11B, the ampoule 20 is accommodated in the concave portion, which is to become the reservoir 16. In addition, the sealing material 30 (low-melting-point glass frit) is disposed on the upper side of the container body 12c, and in an environment at a low pressure closer to vacuum or in an inert gas, the upper lid 12b is disposed on the upper side of the container body 12c, and the two are joined to each other by the sealing material 30. Accordingly, the cell portion 12B is formed.

Subsequently, the cell portion 12B and the coating material 32a disposed therein are heated to the first temperature, and are thereafter cooled to the second temperature. Accordingly, as illustrated in FIG. 11C, the coating layer 32 which is a film of the coating material 32a (chain saturated hydrocarbon) is formed on the inner surface of each of the walls 11 constituting the cell portion 12B (the main chamber 14 and the reservoir 16) and on the surface of the sealing material 30.

When the cell portion 12B is heated to the first temperature and is thereafter cooled to the second temperature, it is preferable that the upper lid 12b side of the cell portion 12B, that is, the side on which the sealing material 30 is disposed reaches the second temperature faster than the other parts. Accordingly, the amount of the material of the coating layer 32 precipitated to the side on which the sealing material 30 is disposed is further increased, and thus the coating layer 32 can be formed to more reliably cover the inner surface of the sealing material 30.

In the fourth embodiment, as in the third embodiment, the disposition of the coating material 32a and the accommodation of the ampoule 20 can be easily performed, and thus the ampoule 20 can be easily disposed at a desired position in the reservoir 16.

The above-described embodiments merely represent an aspect of the invention, and arbitrary modifications and applications can be made without departing from the scope of the invention. As modification examples, for example, the following is considered.

Modification Example 1

Figure 12:
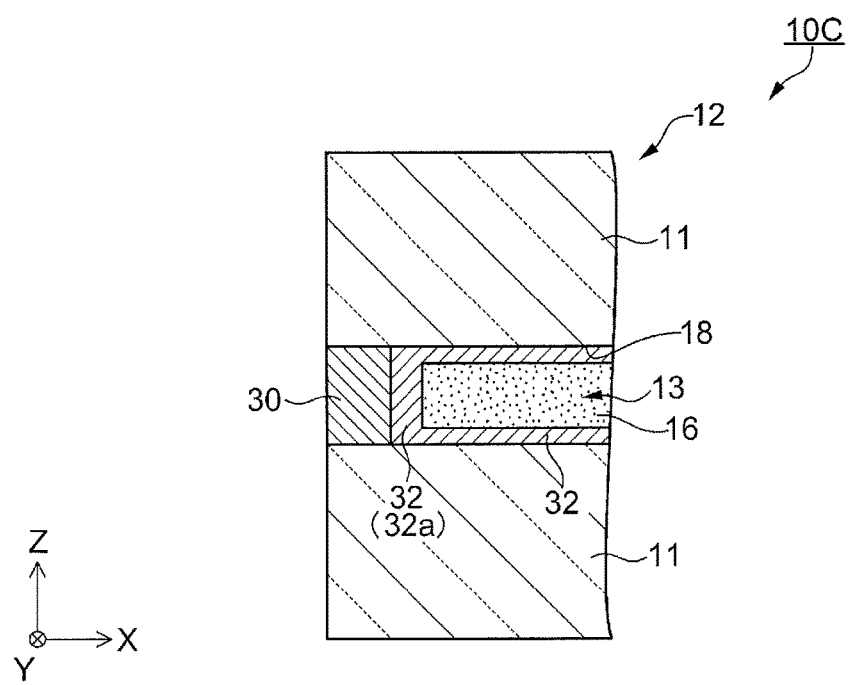
FIG. 12 is a schematic sectional view illustrating the configuration of a gas cell according to Modification Example 1.

The gas cell 10 according to the above-described embodiments includes the lid portion 19 that covers the opening 18. However, a gas cell to which the invention can be applied is not limited to this configuration. FIG. 12 is a schematic sectional view illustrating the configuration of a gas cell according to Modification Example 1. FIG. 12 is an enlarged sectional view of the periphery of the opening 18 and corresponds to FIG. 3A of the first embodiment. A gas cell 10C according to Modification Example 1 is different from that of the first embodiment in that the opening 18 is sealed by the sealing material 30 and the lid portion 19 (see FIG. 3A) is not included.

As illustrated in FIG. 12, the gas cell 10C according to Modification Example 1 does not include the lid portion 19, and the opening 18 is sealed only by the sealing material 30. The surface of the sealing material 30 on the reservoir 16 side is covered with the coating layer 32 (the coating material 32a) formed on the inner surface of the walls 11 of the cell portion 12. Therefore, as in the above-described embodiments, a chemical reaction between the alkali metal and the sealing material 30 is suppressed, and thus a reduction in the amount of the alkali metal gas 13 in the cell portion 12 and leakage of the alkali metal gas 13 to the outside of the cell portion 12 due to the deterioration in the seal can be prevented.

In the configuration of Modification Example 1, since the lid portion 19 is not included, there is an advantage that the gas cell can be manufactured in simple processes. In addition, the heating and pressing processes for performing heating while pressing the lid portion 19 against the cell portion 12 are applied to the configuration of the first embodiment. However, in this modification example, the pressing process is not necessary, and thus the gas cell can be stably manufactured, resulting in the enhancement of yield.

Modification Example 2

Figure 13:
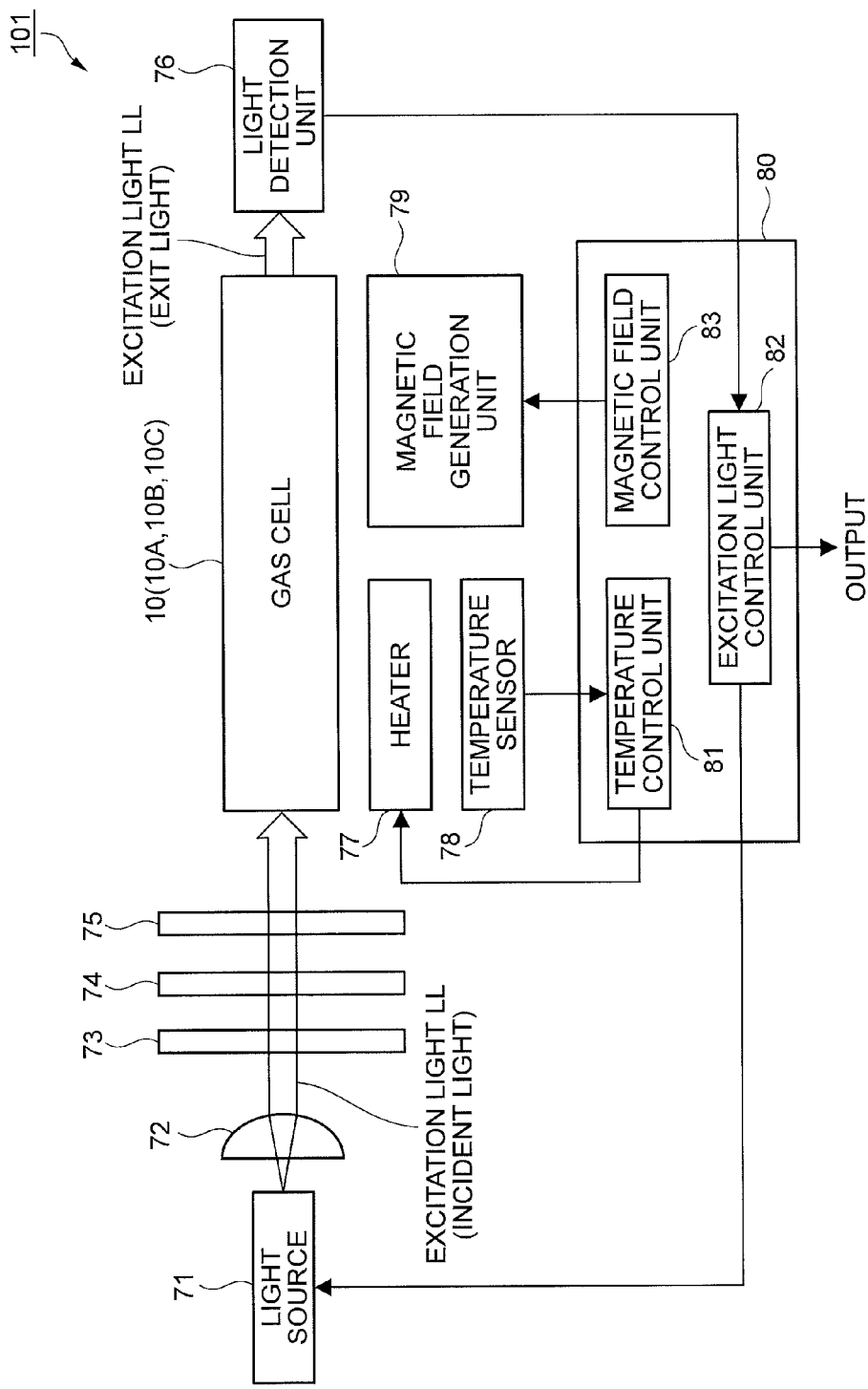
FIG. 13 is a schematic view illustrating the configuration of an atomic oscillator according to Modification Example 2.
Figure 14A:
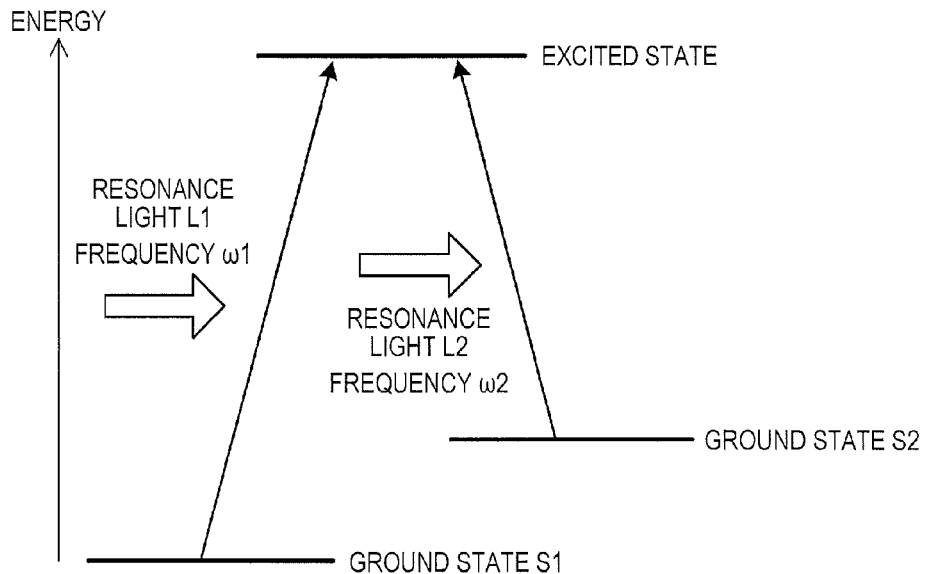
FIGS. 14A and 14B are views illustrating the operation of the atomic oscillator according to Modification Example 2.
Figure 14B:
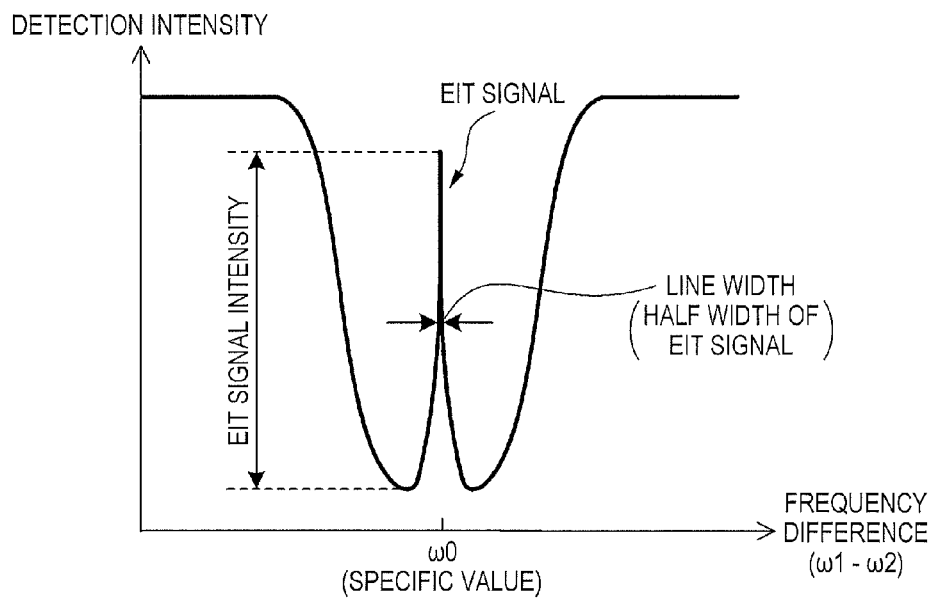

An apparatus to which the gas cell 10 according to the above-described embodiments is applied is not limited to the magnetism measuring device 100. The gas cell 10 may also be applied to an atomic oscillator such as an atomic clock. FIG. 13 is a schematic view illustrating the configuration of an atomic oscillator according to Modification Example 2. FIGS. 14A and 14B are views illustrating the operation of the atomic oscillator according to Modification Example 2.

An atomic oscillator (quantum interference device) 101 according to Modification Example 2 illustrated in FIG. 13 is anatomic oscillator which uses the quantum interference effect. As illustrated in FIG. 13, the atomic oscillator 101 includes the gas cell 10 (or any one of the gas cells 10A, 10B, and 10C) according to the above-described embodiments, alight source 71, optical components 72, 73, 74, and 75, a light detection unit 76, a heater 77, a temperature sensor 78, a magnetic field generation unit 79, and a control unit 80.

The light source 71 emits two types of beams (resonance light L1 and resonance light L2 illustrated in FIG. 14A) having different frequencies, which will be described later, as excitation light LL for exciting alkali metal atoms in the gas cell 10. The light source 71 is formed as a semiconductor laser such as a vertical-cavity surface-emitting laser (VCSEL). The optical components 72, 73, 74, and 75 are provided between the light source 71 and the gas cell 10 on the optical path of the excitation light LL and are arranged in the order of the optical component 72 (lens), the optical component 73 (polarizing plate), the optical component 74 (neutral-density filter), and the optical component 75 (λ/4 wave plate) in a direction from the light source 71 side toward the gas cell 10 side.

The light detection unit 76 detects the intensity of the excitation light LL (the resonance light L1 and L2) transmitted through the inside of the gas cell 10. The light detection unit 76 is formed as, for example, a solar cell or photodiode and is connected to an excitation light control unit 82 of the control unit 80, which will be described later. The heater 77 (heating unit) heats the gas cell 10 to allow the alkali metal in the gas cell 10 to be maintained in a gas phase (as the alkali metal gas 13). The heater 77 (heating unit) is formed as, for example, a heating resistor.

In order to control the amount of heat generated by the heater 77, the temperature sensor 78 detects the temperature of the heater 77 or the gas cell 10. The temperature sensor 78 is formed as various well-known temperature sensors such as a thermistor or a thermocouple. The magnetic field generation unit 79 generates a magnetic field in which a plurality of degenerate energy levels of the alkali metal in the gas cell 10 are split by the Zeeman effect. Due to the Zeeman splitting, the gaps between the different degenerate energy levels of the alkali metal can be increased, resulting in the enhancement of resolution. As a result, the precision of the oscillation frequency of the atomic oscillator 101 can be increased. The magnetic field generation unit 79 is formed as, for example, a Helmholtz coil or a solenoid coil.

The control unit 80 includes the excitation light control unit 82 which controls the frequency of the excitation light LL (the resonance light L1 and L2) emitted by the light source 71, a temperature control unit 81 which controls conduction to the heater 77 on the basis of the detection result of the temperature sensor 78, and a magnetic field control unit 83 which controls a magnetic field generated by the magnetic field generation unit 79 to be constant. The control unit 80 is provided, for example, in an IC chip mounted on a substrate.

The principle of the atomic oscillator 101 is simply described. FIG. 14A is a view illustrating the energy states of the alkali metal in the gas cell 10 of the atomic oscillator 101, and FIG. 14B is a graph representing the relationship between the difference in frequency between the two beams from the light source 71 of the atomic oscillator 101 and the detection intensity detected by the light detection unit 76. As illustrated in FIG. 14A, the alkali metal (the alkali metal gas 13) sealed in the gas cell 10 has energy levels of a three-level system and may have three states including two ground states (a ground state S1, and a ground state S2) having different energy levels and an excited state. Here, the ground state S1 is a lower energy state than the ground state S2.

When the two types of resonance light L1 and L2 having different frequencies illuminate the alkali metal gas 13, the light absorbance (light transmittance) of the alkali metal gas 13 that absorbs the resonance light L1 and L2 varies according to the difference ($\omega 1-\omega 2$) between a frequency $\omega 1$ of the resonance light L1 and a frequency $\omega 2$ of the resonance light L2. When the difference ($\omega 1-\omega 2$) between the frequency $\omega 1$ of the resonance light L1 and the frequency $\omega 2$ of the resonance light L2 is coincident with a frequency corresponding to the energy difference between the ground state S1 and the ground state S2, excitation from each of the ground states S1 and S2 to the excited state stops. At this time, both of the resonance light L1 and L2 is not absorbed by the alkali metal gas 13 and is transmitted therethrough. This phenomenon is called a CPT phenomenon or an electromagnetically induced transparency (EIT) phenomenon.

The light source 71 emits the two types of beams (the resonance light L1 and the resonance light L2) having different frequencies as described above toward the gas cell 10. Here, for example, when the frequency $\omega 2$ of the resonance light L2 is changed while fixing the frequency $\omega 1$ of the resonance light L1, when the difference ($\omega 1-\omega 2$) between the frequency $\omega 1$ of the resonance light L1 and the frequency $\omega 2$ of the resonance light L2 is coincident with a frequency $\omega 0$ corresponding to the energy difference between the ground state S1 and the ground state S2, the detection intensity detected by the light detection unit 76 steeply increases as shown in FIG. 14B. This steep signal is called an EIT signal. The EIT signal has a unique value determined by the type of the alkali metal. Therefore, by using the EIT signal as a reference, the atomic oscillator 101 can be realized with high precision.

The gas cell 10 used in the atomic oscillator 101 is required to have a small size and a long service life. According to the configuration of the gas cell and the manufacturing method thereof in the above-described embodiments, the gas cell 10 having a small size and a long service life can be stably manufactured, and can be appropriately used in the atomic oscillator 101 which has a small size and a long service life with high precision.

The entire disclosure of Japanese Patent Application No. 2015-87329, filed Apr. 22, 2015 is expressly incorporated by reference herein.

What is claimed is:

1. A magnetism measuring device comprising:
   a wall forming a closed container;
   a first hole which is open to a portion of the wall;
   a sealing material which seals the first hole;
   a chain saturated hydrocarbon which covers and abuts the sealing material on an inside of the closed container; and
   an alkali metal gas which is sealed in the closed container.

2. The magnetism measuring device according to claim 1, further comprising:
   a lid which covers the first hole,
   wherein the sealing material is disposed to surround the first hole between the lid and the wall.

3. The magnetism measuring device according to claim 1,
   wherein the closed container includes a first chamber, and a second chamber which is connected to the first chamber via a second hole, and
   the first hole is formed in the wall of the second chamber.

4. The magnetism measuring device according to claim 3,
   wherein the first hole is formed in the wall of the second chamber on a site opposite to the first chamber.

5. A manufacturing method of a magnetism measuring device comprising:
   forming a container which is formed of a wall, the wall has a first hole that is open to a portion whereof, and accommodates an ampoule, in which a material having alkali metal atoms is sealed, and a chain saturated hydrocarbon;
   sealing the first hole using a sealing material;
   heating the container having the first hole sealed by the sealing material to a first temperature; and
   cooling the container having the first hole sealed by the sealing material to a second temperature lower than the first temperature.

6. The manufacturing method of a magnetism measuring device according to claim 5, further comprising:
   breaking the ampoule after the cooling of the container.

7. The manufacturing method of a magnetism measuring device according to claim 5,
   wherein the first temperature is higher than a melting point of the chain saturated hydrocarbon, and
   the second temperature is lower than the melting point of the chain saturated hydrocarbon.

8. The manufacturing method of a magnetism measuring device according to claim 5,
   wherein, in the cooling of the container, there is a period in which a temperature of a portion of the container at which the first hole is positioned is lower than temperatures of the other parts.

9. The manufacturing method of a magnetism measuring device according to claim 5, wherein, in the cooling of the container, the portion of the container at which the first hole is positioned reaches the second temperature faster than the other parts.

10. The manufacturing method of a magnetism measuring device according to claim 5,
   wherein the container is a closed container which is formed of the wall and has the first hole which is open to the portion of the wall, and
   the forming of the container includes
      disposing the ampoule and the chain saturated hydrocarbon in the container through the first hole, and
      evacuating an inside of the container through the first hole.

11. The manufacturing method of a magnetism measuring device according to claim 5,
   wherein the container includes a concave container body, which is formed of the wall and has the first hole, and an upper lid, which is positioned on an upper side of the container body, and
   the forming of the container includes
      disposing the ampoule and the chain saturated hydrocarbon in the container body,
      fixing the upper lid to the upper side of the container body to allow the container to be a closed container, and
      evacuating an inside of the container through the first hole.

12. A gas cell comprising:
   a wall forming a closed container;
   a first hole which is open to a portion of the wall;
   a sealing material which seals the first hole;
   a chain saturated hydrocarbon which covers and abuts the sealing material on an inside of the closed container; and
   an alkali metal gas which is sealed in the closed container.

13. A manufacturing method of a gas cell comprising:
   forming a container which is formed of a wall, has a first hole that is open to a portion of the wall, and accommodates an ampoule, in which a material having alkali metal atoms is sealed, and a chain saturated hydrocarbon;
   sealing the first hole using a sealing material;
   heating the container having the first hole sealed by the sealing material to a first temperature; and
   cooling the container having the first hole sealed by the sealing material to a second temperature lower than the first temperature.

* * * * *